(12) United States Patent
Lee et al.

(10) Patent No.: US 11,914,885 B2
(45) Date of Patent: Feb. 27, 2024

(54) MEMORY CONTROLLER AND OPERATING METHOD THEREOF

(71) Applicant: SK hynix Inc., Icheon-si (KR)

(72) Inventors: Dong Uk Lee, Icheon-si (KR); Hae Chang Yang, Icheon-si (KR); Hun Wook Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 153 days.

(21) Appl. No.: 17/577,213

(22) Filed: Jan. 17, 2022

(65) Prior Publication Data

US 2023/0011946 A1     Jan. 12, 2023

(30) Foreign Application Priority Data

Jul. 6, 2021   (KR) .......................... 10-2021-0088748

(51) Int. Cl.
| | | |
|---|---|---|
| *G11C 16/34* | (2006.01) | |
| *G06F 3/06* | (2006.01) | |
| *G11C 16/04* | (2006.01) | |
| *G11C 16/26* | (2006.01) | |
| *G11C 16/10* | (2006.01) | |
| *G11C 29/52* | (2006.01) | |
| *G11C 16/08* | (2006.01) | |
| *G06F 12/02* | (2006.01) | |
| *G11C 29/50* | (2006.01) | |

(52) U.S. Cl.
CPC ............ *G06F 3/0653* (2013.01); *G06F 3/064* (2013.01); *G06F 3/0655* (2013.01); *G06F 3/0679* (2013.01); *G06F 12/0246* (2013.01); *G11C 16/0483* (2013.01); *G11C 16/08* (2013.01); *G11C 16/10* (2013.01); *G11C 16/26* (2013.01); *G11C 16/349* (2013.01); *G11C 16/3427* (2013.01); *G11C 16/3459* (2013.01); *G11C 29/50004* (2013.01); *G11C 29/52* (2013.01)

(58) Field of Classification Search
CPC .... G06F 3/064; G06F 12/0246; G06F 3/0614; G11C 16/0483; G11C 16/3427; G11C 16/349; G11C 29/50004; G11C 16/3422
See application file for complete search history.

(56) References Cited

U.S. PATENT DOCUMENTS

2015/0228345 A1*  8/2015  Kwon ................ G11C 16/0483
                                                    365/185.18
2020/0350022 A1* 11/2020  Choo ..................... G11C 16/08

FOREIGN PATENT DOCUMENTS

KR    1020150116351 A    10/2015
KR    1020190054774 A     5/2019

* cited by examiner

*Primary Examiner* — Jay W. Radke
(74) *Attorney, Agent, or Firm* — William Park & Associates Ltd.

(57) ABSTRACT

The present disclosure provides a memory controller including a state detector detecting whether the memory device is in an idle state, a program controller, based on detection information that indicates a state of the memory device, selecting neighboring strings that are adjacent to a string that is coupled to a memory cell, among the memory cells, on which a program operation or a read operation was performed before the detecting, selecting monitoring memory cells that are coupled to at least one word line, the memory cells being a part of the neighboring strings, and controlling the memory device to perform a plurality of loops to program the monitoring memory cells, and a bad block selector selecting a memory block with the monitoring memory cells as a bad block based on a rate of increase in threshold voltage of a threshold voltage distribution of the monitoring memory cells.

20 Claims, 13 Drawing Sheets

MEMORY CONTROLLER AND OPERATING METHOD THEREOF

CROSS-REFERENCE TO RELATED APPLICATION

The present application claims priority under 35 U.S.C. § 119(a) to Korean patent application number 10-2021-0088748 filed on Jul. 6, 2021, in the Korean Intellectual Property Office, the entire disclosure of which is incorporated by reference herein.

BACKGROUND

1. Technical Field

Various embodiments of the invention relate generally to an electronic device, and more particularly, to a memory controller and a method of operating the memory controller.

2. Related Art

A storage device may store data in response to a host device, such as a computer, a smartphone, and a smartpad. Examples of the storage device may include a device for storing data in a magnetic disk, such as a hard disk drive (HDD), and a device for storing data in a semiconductor memory, such as a solid state drive (SSD) or a memory card, especially in a nonvolatile memory.

A storage device may include a memory device that stores data and a memory controller that controls the memory device. A memory device may be classified into a volatile memory and a nonvolatile memory. Nonvolatile memories may include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferroelectric RAM (FRAM).

SUMMARY

According to an embodiment, a memory controller controlling a memory device with memory cells that are included in a plurality of strings, respectively, may include a state detector detecting whether the memory device is in an idle state, a program controller selecting, based on detection information that indicates a state of the memory device, neighboring strings that are adjacent to a string that comprises a memory cell, among the memory cells, on which a program operation or a read operation was performed before the detecting, selecting monitoring memory cells that are coupled to at least one word line, the memory cells being a part of the neighboring strings, and controlling the memory device to perform a plurality of loops to program the monitoring memory cells, and a bad block selector selecting a memory block with the monitoring memory cells as a bad block based on a rate of increase in threshold voltage of a threshold voltage distribution of the monitoring memory cells.

According to an embodiment, a method of operating a memory controller controlling a memory device with memory cells that are coupled to a plurality of strings, respectively, may include detecting a state of the memory device, selecting, based on an idle state of the memory device being detected, neighboring strings that are adjacent to a string that comprises a memory cell, among the memory cells, on which a program operation or a read operation was performed before the detecting, selecting memory cells that are coupled to at least one word line, the memory cells being a part of the neighboring strings, as monitoring memory cells, outputting a program command to perform a plurality of loops to program the monitoring memory cells, and selecting a memory block with the monitoring memory cells as a bad block based on a rate of increase in threshold voltage of a threshold voltage distribution of the monitoring memory cells.

According to an embodiment, a storage device may include a memory device including memory cells that are included in each of a plurality of strings, and a memory controller detecting whether the memory device is in an idle state or not, selecting memory cells that are adjacent to a memory cell on which a program operation or a read operation was performed before the detecting, among the memory cells, as monitoring memory cells, controlling the memory device to perform a plurality of loops that program the monitoring memory cells, and selecting a memory block with the monitoring memory cells as a bad block based on a rate of increase in threshold voltage of a threshold voltage distribution of the monitoring memory cells.

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various embodiments are directed to a memory controller and an operating method thereof preventing errors that are uncorrectable by error correction code (UECC) by processing a memory block which is likely a bad block as a bad block in advance.

Figure 1:
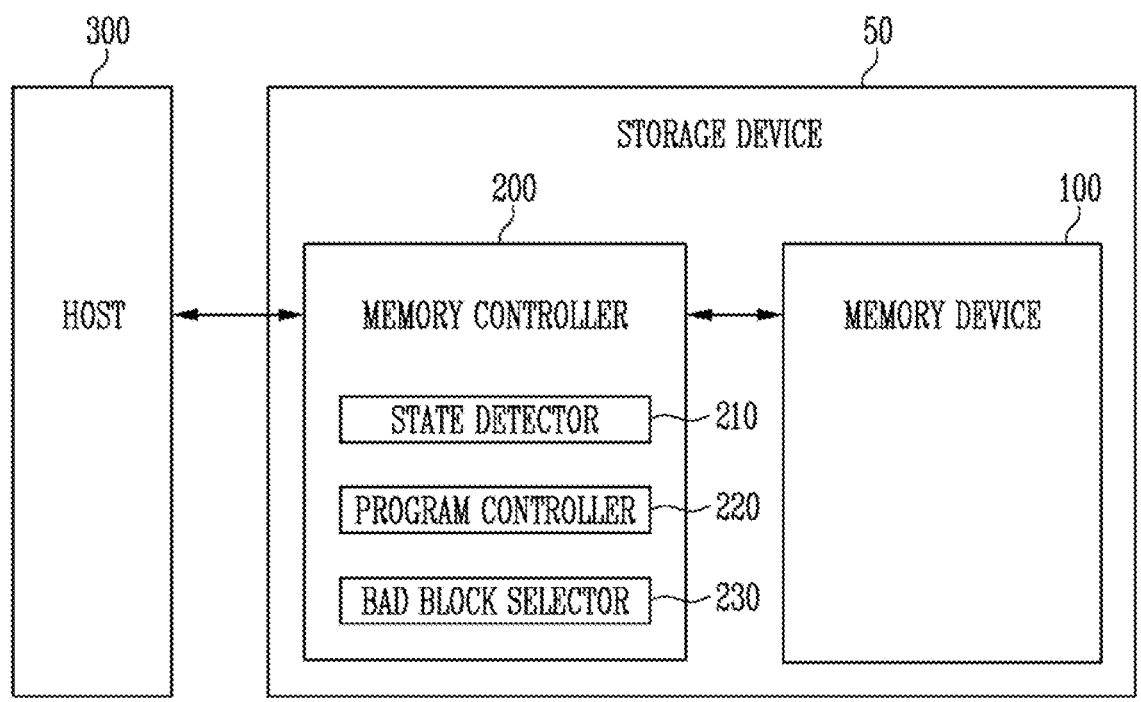
FIG. 1 is a block diagram illustrating a storage device.

FIG. 1 is a block diagram illustrating a storage device 50.

Referring to FIG. 1, the storage device 50 may include a memory device 100 and a memory controller 200.

The storage device 50 may be configured to store data in response to a host 300. Examples of the storage device 50 may include a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that corresponds to a communication method with the host 300. For example, the storage device 50 may be configured as any one of the various kinds of storage devices, such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of the various types of packages. For example, the storage device 50 may be manufactured as any one of various kinds of package types, such as a package-on-package (POP), a system-in-package (SIP), a system-on-chip (SOC), a multi-chip package (MCP), a chip-on-board (COB), a wafer-level fabricated package (WFP), a wafer-level stack package (WSP) and the like.

The memory device 100 may store data. The memory device 100 may operate in response to the memory controller 200. The memory device 100 may include a memory cell array that includes a plurality of memory cells that store data. The memory cell array may include a plurality of memory blocks. Each of the memory blocks may include a plurality of memory cells. The plurality of memory cells may form a plurality of pages. According to an embodiment, a page may be a unit for storing data in the memory device 100 or reading data that is stored in the memory device 100. A memory block may be a unit for erasing data.

According to an embodiment, examples of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), or a spin transfer torque random access memory (STT-RAM). In this specification, by way of example, features and aspects of the invention are described in the context in which the memory device 100 is a NAND flash memory.

The memory device 100 may have a two-dimensional array structure or a three-dimensional array structure. Hereinafter, the three-dimensional array structure is described as an embodiment. However, the present disclosure is not limited thereto. The present disclosure may also be applied not only to a flash memory in which a charge storage layer includes a conductive floating gate (FG), but also to a charge trap flash (CTF) memory in which a charge storage layer includes an insulating layer.

According to an embodiment, the memory device 100 may operate in a single level cell (SLC) method by which a single data bit is stored in a single memory cell. However, the memory device 100 may operate based on a method of storing at least two data bits in a single memory cell. For example, the memory device 100 may operate based on a multi-level cell (MLC) method for storing two data bits in a single memory cell, a triple level cell (TLC) method for storing three data bits, or a quadruple level cell (QLC) method for storing four data bits.

The memory device 100 may receive a command and an address from the memory controller 200 and access an area that is selected in response to the address in the memory cell array. That is, the memory device 100 may perform an operation that corresponds to the command on the area that is selected in response to the address. For example, the memory device 100 may perform a write operation (program operation), a read operation, or an erase operation in response to a received command. For example, when receiving a program command, the memory device 100 may program an area that is selected by an address with data. For example, when receiving a read command, the memory device 100 may read data from the area that is selected by the address. For example, when receiving an erase command, the memory device 100 may erase data from the area that is selected by the address.

The memory controller 200 may control the general operations of the storage device 50.

When a power voltage is applied to the storage device 50, the memory controller 200 may execute firmware. When the memory device 100 is a flash memory device, the memory controller 200 may execute firmware, such as a Flash Translation Layer (FTL) for controlling the communication between the host 300 and the memory device 100.

According to an embodiment, the memory controller 200 may include firmware (not shown) that receives data and a logical block address (LBA) from the host 300 and converts the logical block address (LBA) into a physical block address (PBA), indicating an address of memory cells in which data that is included in the memory device 100 is stored. In addition, the memory controller 200 may store a logical-physical address mapping table that configures a mapping relationship between the logical block address LBA and the physical block address PBA in a buffer memory.

The memory controller 200 may control the memory device 100 to perform a program operation, a read operation, an erase operation, or the like in response to a request from the host 300. For example, when receiving a program request from the host 300, the memory controller 200 may change the program request into a program command and provide the program command, the physical block address PBA, and data to the memory device 100. When receiving a read request, along with the logical block address, from the host 300, the memory controller 200 may change the read request into a read command, select a physical block address that corresponds to the logical block address, and provide the read command and the physical block address PBA to the memory device 100. When receiving an erase request, along with the logical block address, from the host 300, the memory controller 200 may change the erase request into an erase command, select a physical block address that corresponds to the logical block address, and provide the erase command and the physical block address PBA to the memory device 100.

According to an embodiment, as the number of strings that are respectively included in the plurality of memory blocks included in the memory device 100 increases, the distance between the memory cells may decrease. As the distance between the memory cells decreases, memory cells that are adjacent to a memory cell on which a program operation or a read operation is performed may deteriorate (their threshold voltage, which represents data deteriorates) due to the program operation or the read operation. As the neighboring memory cells are shifted in threshold voltage by the deterioration, data that is read during the read operation on the neighboring memory cells may include errors that are uncorrectable by error correction code (UECC).

Therefore, according to the present disclosure, the memory controller 200 may detect that the memory device 100 is in an idle state or a predetermined period has passed and may control the memory device 100 to program the neighboring memory cells according to the detection result. In addition, after the neighboring memory cells are programmed, the memory controller 200 may determine whether or not to process a memory block with the neighboring memory cells as a bad block, depending on whether a rate of increase in threshold voltage of a threshold voltage distribution of the neighboring memory cells exceeds a reference value.

More specifically, when the rate of increase in threshold voltage of the threshold voltage distribution exceeds the reference value, the memory controller 200 may process the corresponding memory block as a bad block. In other words, errors which are uncorrectable by error correction code (UECC) may be prevented by determining the memory block with the neighboring memory cells as a memory block that is likely to become a bad block, and processing the corresponding memory block as a bad block in advance before the bad block occurs.

To perform the above-described operations, the memory controller 200 may include a state detector 210, a program controller 220, and a bad block selector 230.

According to an embodiment, the memory controller 200 may include the state detector 210. The state detector 210 may detect an idle state of the memory device 100. When the idle state of the memory device 100 is detected, the state detector 210 may provide detection information that indicates that the memory device 100 is in the idle state.

According to another embodiment, the state detector 210 may provide detection information every predetermined period. The detection information may indicate that a predetermined time has passed.

According to an embodiment, the memory controller 200 may include the program controller 220. The program controller 220 may control the memory device 100 to perform program loops that program monitoring memory cells based on the detection information that is received from the state detector 210. The number of program loops that program the monitoring memory cells may be set in advance.

The monitoring memory cells may refer to memory cells that are coupled to a predetermined word line, the memory cells being a part of the strings that are adjacent to a string in which a memory cell on which a program operation or a read operation was performed, is included. Each of the program loops may include a program operation and a verify operation. In addition, the predetermined word line may refer to a line in which severe deterioration is expected to occur and may be at least one of a word line that is adjacent to a source select line, a word line that is adjacent to a drain select line, and a word line that is located at the center. In other words, there may be two or more predetermined word lines.

According to an embodiment, when the program loops are performed on the monitoring memory cells, the program controller 220 may suspend the program loops at a specific time. In other words, when the monitoring memory cells are being programmed, the program controller 220 may output a suspend command that provides instructions to suspend the program loop at a predetermined time. For example, the program controller 220 may output a suspend command when the memory device 100 performs one program loop, two program loops, or three program loops.

When the program loop is suspended in response to the suspend command, the program controller 220 may output a program command to instruct the program loops to resume from the beginning. The program controller 220 may alternately output the program command and the suspend command before the final program loop, among predetermined program loops, is performed.

According to an embodiment, the memory controller 200 may include the bad block selector 230. The bad block selector 230 may determine a rate of increase in threshold voltage of a threshold voltage distribution of monitoring memory cells based on a verify result of a verify operation on the monitoring memory cells, or a read result of a read operation that corresponds to a read command that is output after a suspend command is output. In addition, the bad block selector 230 may select a memory block with the monitoring memory cells as a bad block according to the rate of increase in threshold voltage of the threshold voltage distribution.

According to an embodiment, the memory controller 200 may control at least two memory devices. The memory controller 200 may control the memory devices according to an interleaving scheme so as to improve operation performance.

The host 300 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
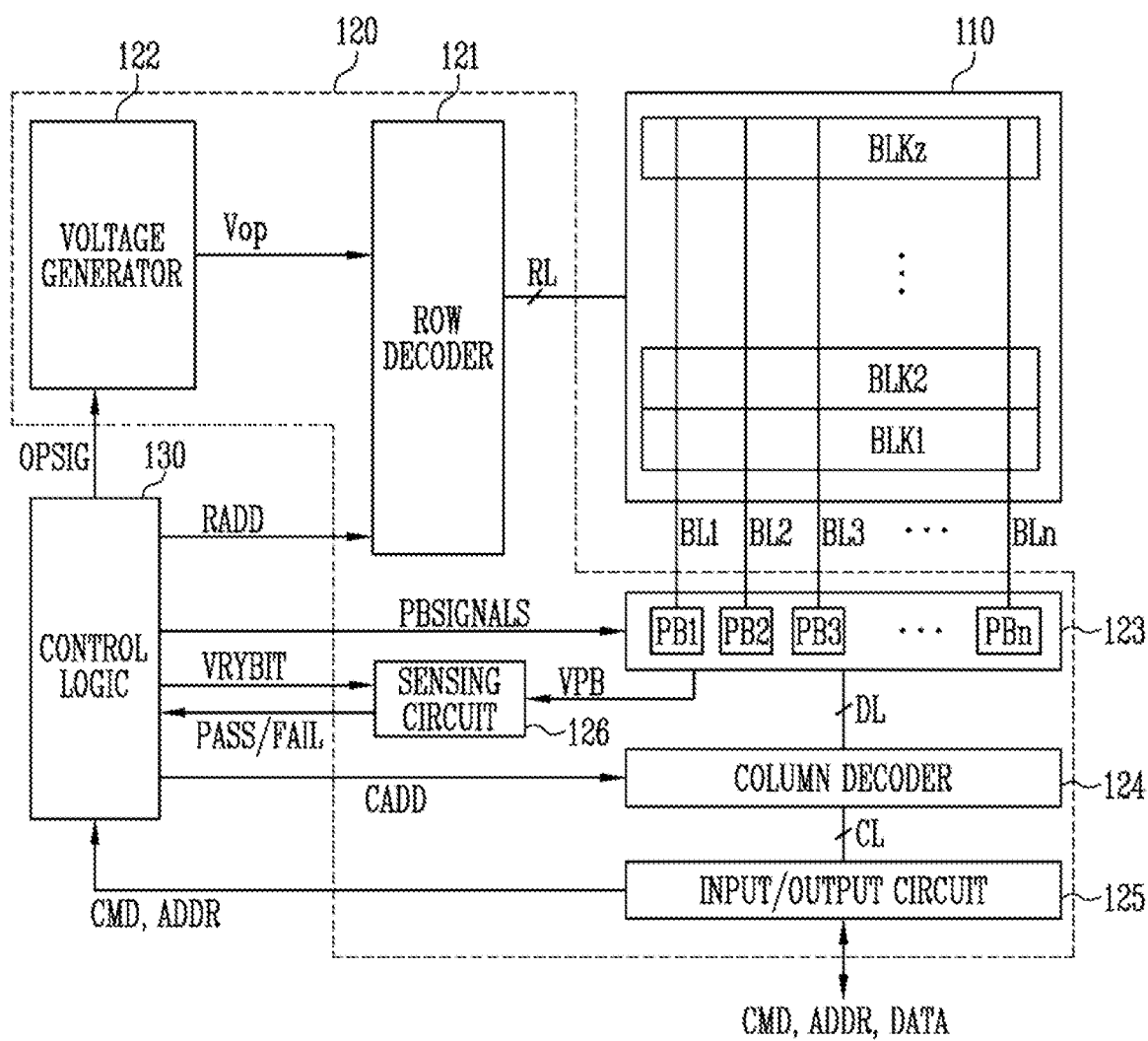
FIG. 2 is a diagram illustrating the structure of a memory device of FIG. 1.

FIG. 2 is a diagram illustrating the structure of the memory device 100 of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be coupled to a row decoder 121 through row lines RL. The plurality of memory blocks BLK1 to BLKz may be coupled to a page buffer group 123 through bit lines BL1 to BLn. Each of the plurality of memory blocks BLK1 to BLKz may include a plurality of memory cells. According to an embodiment, a plurality of memory cells may be non-volatile memory cells. Memory cells that are coupled to the same word line may be defined as one page. Therefore, each memory block may include a plurality of pages.

The row lines RL may include at least one source select line, a plurality of word lines and at least one drain select line.

Each of the memory cells that are included in the memory cell array 110 may be a single level cell (SLC) that stores one data bit, a multi-level cell (MLC) that stores two data bits, a triple level cell (TLC) that stores three data bits, or a quadruple level cell (QLC) that stores four data bits.

The peripheral circuit 120 may be configured to perform a program operation, a read operation, or an erase operation on a selected area of the memory cell array 110 in response to the control logic 130. The peripheral circuit 120 may drive the memory cell array 110. For example, the peripheral circuit 120 may apply various operating voltages to the row lines RL and the bit lines BL1 to BLn, or may discharge the applied voltages in response to the control logic 130.

The peripheral circuit 120 may include the row decoder 121, a voltage generator 122, the page buffer group 123, a column decoder 124, an input/output circuit 125, and a sensing circuit 126.

The row decoder 121 may be coupled to the memory cell array 110 through the row lines RL. The row lines RL may include at least one source select line, a plurality of word lines, and at least one drain select line. According to an embodiment, the word lines may include normal word lines and dummy word lines. According to an embodiment, the row lines RL may further include a pipe select line.

The row decoder 121 may be configured to decode a row address RADD that is received from the control logic 130. The row decoder 121 may select at least one memory block, among the memory blocks BLK1 to BLKz, according to the decoded block address. The row decoder 121 may select at least one word line of the selected memory block so as to apply voltages that are generated by the voltage generator 122 to at least one word line according to the decoded address.

For example, during a program operation, the row decoder 121 may apply a program voltage to the selected word line and a program pass voltage with a lower voltage level than the program voltage to unselected word lines. During a program verify operation, the row decoder 121 may apply a verify voltage to the selected word line and a verify pass voltage that is greater than the verify voltage to the unselected word lines. During a read operation, the row decoder 121 may apply a read voltage to the selected word line and a read pass voltage that is greater than the read voltage to the unselected word lines.

According to an embodiment, an erase operation of the memory device 100 may be performed in units of memory blocks. During an erase operation, the row decoder 121 may select one of the memory blocks according to the decoded address. During the erase operation, the row decoder 121 may apply a ground voltage to word lines that are coupled to the selected memory block.

The voltage generator 122 may be controlled by the control logic 130. The voltage generator 122 may be configured to generate a plurality of voltages by using an external power voltage that is supplied to the memory device 100. More specifically, the voltage generator 122 may generate various operating voltages Vop for program, read, and erase operations in response to an operation signal OPSIG. For example, the voltage generator 122 may generate a program voltage, a verify voltage, a pass voltage, a read voltage, and an erase voltage in response to the control logic 130.

According to an embodiment, the voltage generator 122 may generate an internal power voltage by regulating the external power voltage. The internal power voltage that is generated by the voltage generator 122 may serve as an operating voltage of the memory device 100.

According to an embodiment, the voltage generator 122 may generate a plurality of voltages by using the external power voltage or the internal power voltage.

For example, the voltage generator 122 may include a plurality of pumping capacitors that receive the internal power voltage and may generate a plurality of voltages by selectively activating the plurality of pumping capacitors in response to the control logic 130.

The plurality of generated voltages may be supplied to the memory cell array 110 by the row decoder 121.

The page buffer group 123 may include first to nth page buffers PB1 to PBn. The first to nth page buffers PB1 to PBn may be coupled to the memory cell array 110 through the first to nth bit lines BL1 to BLn, respectively. The first to nth page buffers PB1 to PBn may operate in response to the control logic 130. More specifically, the first to nth page buffers PB1 to PBn may operate in response to page buffer control signals PBSIGNALS. For example, the first to nth page buffers PB1 to PBn may temporarily store data that is received through the bit lines BL1 to BLn, or may sense voltages or currents in the bit lines BL1 to BLn during a read or verify operation.

More specifically, during a program operation, the first to nth page buffers PB1 to PBn may transfer data DATA that is received through the input/output circuit 125 to selected memory cells through the first to nth bit lines BL1 to BLn when a program voltage is applied to a selected word line during a program operation. Memory cells of the selected page may be programmed according to the transferred data DATA. During a program verify operation, the first to nth page buffers PB1 to PBn may read page data by sensing the voltage or current that is received from the selected memory cells through the first to nth bit lines BL1 to BLn, respectively.

During a read operation, the first to nth page buffers PB1 to PBn may read the data DATA from the memory cells of the selected page through the first to nth bit lines BL1 to BLn and output the read data DATA to the input/output circuit 125 in response to the column decoder 124.

During an erase operation, the first to nth page buffers PB1 to PBn may float or apply an erase voltage to the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL, or may exchange data with the input/output circuit 125 through column lines CL.

The input/output circuit 125 may transfer a command CMD and an address ADDR from the memory controller 200 of FIG. 1 as described above with reference to FIG. 1 to the control logic 130, or may exchange the data DATA with the column decoder 124.

The sensing circuit 126 may generate a reference current in response to an allowable bit signal VRYBIT and compare a sensing voltage VPB that is received from the page buffer group 123 with a reference voltage that is generated by the reference current to output a pass signal PASS or a fail signal FAIL during a read operation or a verify operation.

The control logic 130 may control the peripheral circuit 120 by outputting the operation signal OPSIG, the row address RADD, the page buffer control signals PBSIGNALS, and the allowable bit signal VRYBIT in response to the command CMD and the address ADDR. For example, the control logic 130 may control a read operation of a selected memory block in response to a sub-block read command and an address. In addition, the control logic 130 may control an erase operation of a selected sub-block that is included in the selected memory block in response to a sub-block erase command and an address. In addition, the control logic 130 may determine whether the verify operation passes or fails in response to the pass or fail signal PASS or FAIL.

Figure 3:
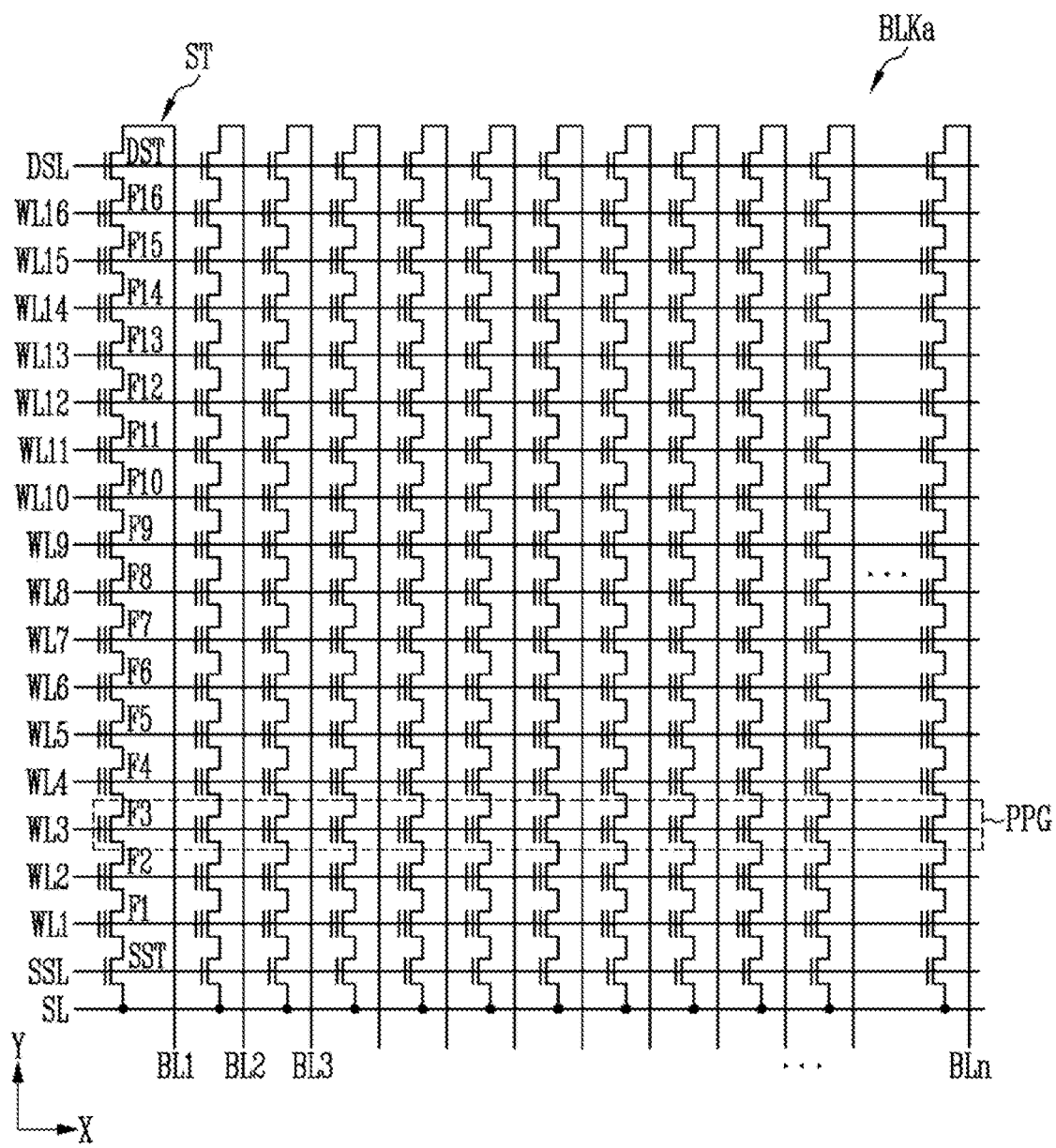
FIG. 3 is a diagram illustrating an embodiment of a memory cell array shown in FIG. 2.

FIG. 3 is a diagram illustrating an embodiment of the memory cell array 110 shown in FIG. 2.

Referring to FIGS. 2 and 3, FIG. 3 is a circuit diagram illustrating one memory block BLKa, among the plurality of the memory blocks BLK1 to BLKz, included in the memory cell array 110 of FIG. 2.

A first select line, word lines, and a second select line that are arranged in parallel with each other may be coupled to the memory block BLKa. For example, the word lines may be arranged in parallel between the first and second select lines. The first select line may be a source select line SSL and the second select line may be a drain select line DSL.

More specifically, the memory block BLKa may include a plurality of strings that are coupled between the bit lines BL1 to BLn and a source line SL. The bit lines BL1 to BLn may be coupled to the strings, respectively, and the source line SL may be commonly coupled to the strings. Since the strings may have the same configuration, a string ST that is coupled to the first bit line BL1 will be described below as an example in more detail.

The string ST may include a source select transistor SST, a plurality of memory cells F1 to F16, and a drain select transistor DST that are coupled in series between the source line SL and the first bit line BL1. Each string ST may include at least one source select transistor SST, at least one drain select transistor DST, and more memory cells than the memory cells F1 to F16 as shown in FIG. 3.

A source of the source select transistor SST may be coupled to the source line SL and a drain of the drain select transistor DST may be coupled to the first bit line BL1. The memory cells F1 to F16 may be coupled in series between the source select transistor SST and the drain select transistor DST. Gates of the source select transistors SST that are included in different strings ST may be coupled to the source select line SSL, gates of the drain select transistors DST may be coupled to the drain select line DSL, and gates of the memory cells F1 to F16 may be coupled to the plurality of word lines WL1 to WL16. A group of memory cells that are coupled to the same word line, among memory cells that are included in different strings ST, may be referred to as a physical page PPG. Therefore, the memory block BLKa may include as many physical pages PPG as the number of word lines WL1 to WL16.

One memory cell may store one-bit of data. This memory cell is generally referred to as a single level cell (SLC). One physical page PPG may store one logical page (LPG) data. One LPG data may include as many data bits as the number of cells that are included in one physical page PPG. However, a single memory cell may store two or more bits of data. This memory cell is typically referred to as a "multi-level cell (MLC)". One physical page PPG may store data that corresponds to two or more logical pages LPG.

Although a memory cell in which two or more bits of data are stored is referred to as a multi-level cell (MLC), as the number of bits of data that is stored in one memory cell has increased, the multi-level cell (MLC) may now mean a memory cell in which two bits of data are stored. A memory cell in which three or more bits of data are stored is referred to as a triple level cell (TLC). A memory cell in which four or more bits of data are stored may be referred to as a quadruple level cell (QLC). In addition, a memory cell method of storing a plurality of bits of data has been developed. This embodiment is applicable to the memory device 100 in which two or more bits of data are stored.

In another embodiment, a memory block may have a three-dimensional structure. Each memory block may include a plurality of memory cells that are stacked over a substrate. The plurality of memory cells may be arranged in +X direction, +Y direction, and +Z direction.

Figure 4:
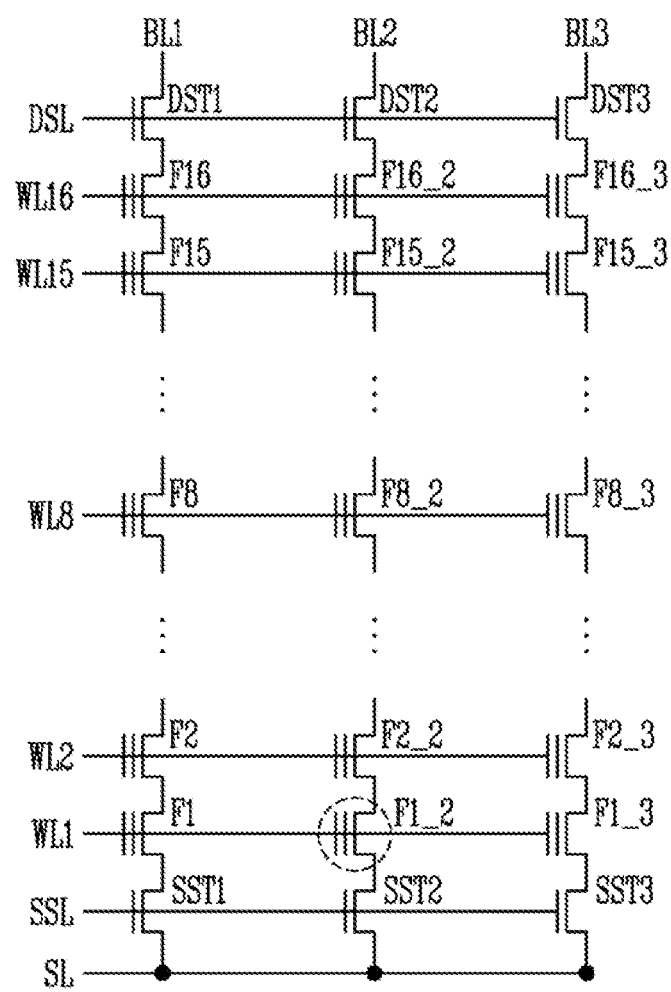
FIG. 4 is a diagram illustrating a method of selecting a monitoring memory cell.

FIG. 4 is a diagram illustrating a method of selecting a monitoring memory cell.

Referring to FIGS. 3 and 4, FIG. 4 illustrates memory cells that are coupled to the first to third bit lines BL1 to BL3, among the bit lines BL1 to BLn of FIG. 3.

According to an embodiment, memory cells of a string that is coupled to the second bit line BL2, among the first to third bit lines BL1 to BL3, may be programmed. For example, a (1_2)th memory cell F1_2, among the memory cells that are coupled to the second bit line BL2, may be programmed. As a program operation is performed on the (1_2)th memory cell F1_2, memory cells of strings that are coupled to the first bit line BL1 or the third bit line BL3 that is adjacent to the second bit line BL2 may deteriorate.

According to an embodiment, data that is stored in the memory cells of the string that is coupled to the second bit line BL2, among the first to third bit lines BL1 to BL3, may be read. For example, data that is stored in the (1_2)th memory cell F1_2, among the memory cells that are coupled to the second bit line BL2, may be read. As a read operation is performed on the data that is stored in the (1_2)th memory cell F1_2, the memory cells of the strings that are coupled to the first bit line BL1 or the third bit line BL3 that is adjacent to the second bit line BL2 may deteriorate.

According to an embodiment, as memory cells of neighboring strings deteriorate due to a program operation or a read operation, a threshold voltage distribution of the corresponding memory cells may be shifted. When the threshold voltage distribution of the neighboring memory cells is shifted, data that is read during a read operation on the corresponding memory cells may include errors that are uncorrectable by error correction code (UECC).

Therefore, to prevent the errors that are uncorrectable by error correction code (UECC), the memory controller 200 of FIG. 1 may determine neighboring strings that are coupled to bit lines that are adjacent to a bit line that is coupled to a memory cell on which a program operation or a read operation was performed when the memory device 100 is in an idle state, or periodically.

In addition, the memory controller 200 of FIG. 1 may select a memory cell of a word line in which severe deterioration is expected to occur, the memory cell being a part of the determined neighboring strings. For example, the memory controller 200 of FIG. 1 may select memory cells that are coupled to at least one word line, the memory cells being a part of the determined neighboring strings, as monitoring memory cells.

When the number of strings that are coupled to a memory block is a reference number or greater, memory cells that are coupled to at least two word lines, the memory cells being a part of the neighboring strings, may be selected as monitoring memory cells.

More specifically, the memory controller 200 of FIG. 1 may select memory cells that are coupled to a word line that is adjacent to the source select line SSL, the memory cells being a part of the neighboring strings, as monitoring memory cells. For example, the memory controller 200 of FIG. 1 may select the first memory cell F1 and a (1_3)th memory cell F1_3 that are memory cells that are coupled to the first word line WL1 that is adjacent to the source select line SSL, among the first to 16th word lines WL1 to WL16, as monitoring memory cells.

In another embodiment, the memory controller 200 of FIG. 1 may select the memory cells that are coupled to a word line that is adjacent to the drain select line DSL, the memory cells being a part of the neighboring strings, as monitoring memory cells. For example, the memory controller 200 of FIG. 1 may select the 16th memory cell F16 and a (16_3)th memory cell F16_3 that are memory cells that are coupled to the 16th word line WL16 that is adjacent to the drain select line DSL, among the first to 16th word lines WL1 to WL16, as monitoring memory cells.

In another embodiment, the memory controller 200 of FIG. 1 may select memory cells that are coupled to a center word line, the memory cells being a part of the neighboring strings, as monitoring memory cells. When the center word line is assumed as the eighth word line WL8, the memory controller 200 of FIG. 1 may select the eighth memory cell F8 and a (8_3)th memory cell F8_3 that are memory cells that are coupled to the eighth word line WL8, among the first to 16th word lines WL1 to WL16, as monitoring memory cells.

When a monitoring memory cell is selected, the memory controller 200 of FIG. 1 may control the memory device 100 of FIG. 1 to perform an incremental step pulse programming (ISPP) operation on the monitoring memory cell.

When the ISPP operation is performed on the monitoring memory cell, whether or not to process a memory block with the monitoring memory cell as a bad block may be determined based on a rate of increase in threshold voltage of a threshold voltage distribution of the monitoring memory cell.

Figure 5:
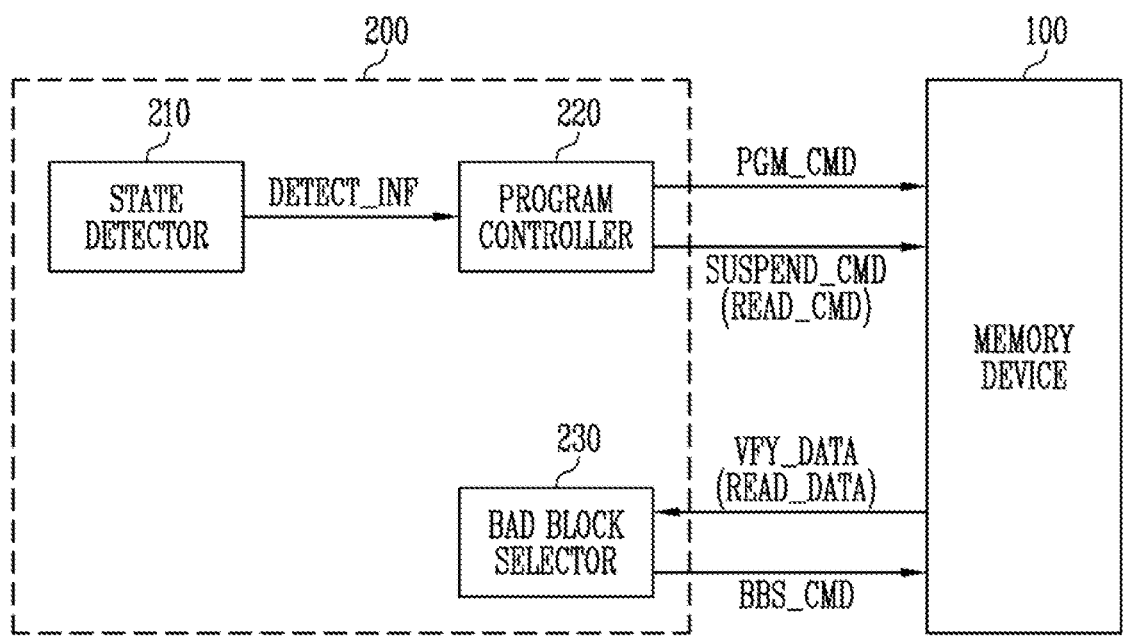
FIG. 5 illustrates the configuration of a memory controller of FIG. 1 and a bad block processing process.

FIG. 5 illustrates the configuration of the memory controller 200 of FIG. 1 and a bad block processing process.

Referring to FIGS. 1 and 5, FIG. 5 illustrates the state detector 210, the program controller 220, and the bad block selector 230 included in the memory controller 200 of FIG. 1.

According to an embodiment, the state detector 210 may detect a state of the memory device 100. For example, the state detector 210 may detect an idle state of the memory device 100 based on state information or a signal that is received from the memory device 100.

According to another embodiment, the state detector 210 may detect that a predetermined period has arrived. In other words, the state detector 210 may detect that the predetermined period has arrived each time a predetermined time passes.

According to an embodiment, when the state detector 210 detects the idle state of the memory device 100 or detects that the predetermined period has arrived, the state detector 210 may output detection information DETECT_INF that indicates that the memory device 100 is in the idle state or the predetermined period has arrived.

According to an embodiment, the program controller 220 may receive the detection information DETECT_INF from the state detector 210. When the program controller 220 receives the detection information DETECT_INF, the program controller 220 may control the programming of the monitoring memory cells.

More specifically, when receiving the detection information DETECT_INF, the program controller 220 may select an arbitrary string, among the strings that are include the memory cells on which the program operation or the read operation was performed, before the program controller 220 receives the detection information DETECT_INF, and may determine neighboring strings that are adjacent to the arbitrary string.

When the neighboring strings are determined, the program controller 220 may select memory cells of a word line in which severe deterioration is expected to occur, the memory cells being a part of the neighboring strings, as monitoring memory cells. For example, the program controller 220 may select memory cells that are coupled to at least one of the word lines that are adjacent to a source select line, a drain select line, and a center word line, the memory cells being a part of the neighboring strings, as monitoring memory cells.

When the monitoring memory cells are selected, the program controller 220 may control the memory device 100 to perform program loops on the monitoring memory cells. The number of monitoring memory cells on which the program loops are performed and the number of program loops may be determined in advance (predetermined), and the monitoring memory cells may be programmed to the highest program state. In addition, each of the program loops may include a program operation and a verify operation.

For example, when the memory device 100 performs a program operation based on a triple-level cell (TLC) method, the monitoring memory cells may be programmed to a seventh program state P7 that is the highest program state, among an erase state E and first to seventh program states P1 to P7.

In another embodiment, when the memory device 100 performs a program operation based on a quadruple-level cell (QLC) method, the monitoring memory cells may be programmed to a 15th program state P15 that is the highest program state, among the erase state E and the first to 15th program states P1 to P15.

According to an embodiment, the program controller 220 may output a program command PGM_CMD to the memory device 100 to program the monitoring memory cells. The memory device 100 may perform program loops on the monitoring memory cells in response to the program command PGM_CMD.

When the memory device 100 performs the program loops, the program controller 220 may output a suspend command SUSPEND_CMD every predetermined time. The predetermined time may refer to a point of time at which the program loops that are increased by one are terminated.

For example, after the first program loop is performed first, among the plurality of program loops, the program controller 220 may output the suspend command SUSPEND_CMD to the memory device 100. The memory device 100 may suspend the program loops from being performed in response to the suspend command SUSPEND_CMD.

When the bad block selector 230 determines a rate of increase in threshold voltage of a threshold voltage distribution of the monitoring memory cells by an additional read operation, the program controller 220 may output the suspend command SUSPEND_CMD and then a read command READ_CMD.

After the program controller 220 outputs the read command READ_CMD, the program controller 220 may output the program command PGM_CMD to program the monitoring memory cells. The program controller 220 may output the program command PGM_CMD to instruct that the program loops are performed again from the beginning. In other words, the memory device 100 may perform the program loops again, starting from the first program loop, in response to the program command that is received from the program controller 220.

Subsequently, the program controller 220 may output the suspend command SUSPEND_CMD to the memory device 100 after the first and second program loops are performed. In other words, when two program loops are performed after the program loops are resumed, the program controller 220 may output the suspend command SUSPEND_CMD that provides instructions to suspend the program loops to the memory device 100.

In the same manner, when the bad block selector 230 determines a rate of increase in threshold voltage of a threshold voltage distribution of monitoring memory cells by an additional read operation, the program controller 220 may output the suspend command SUSPEND_CMD and then the read command READ_CMD.

In the manner as described above, the program controller 220 may alternately output the program command PGM_CMD and the suspend command SUSPEND_CMD until all the predetermined program loops are performed. In addition, program controller 220 may output the read command READ_CMD after outputting the suspend command SUSPEND_CMD.

According to an embodiment, the bad block selector 230 may determine whether or not to process a memory block as a bad block based on verify data VFY_DATA or read data READ_DATA. The verify data VFY_DATA may refer to data that is read during the final verify operation that is performed before receiving the suspend command SUSPEND_CMD, among the verify operations performed on the memory device 100. The read data READ_DATA may refer to data that is read during a read operation that corresponds to the read command READ_CMD. The verify data VFY_DATA or the read data READ_DATA may be received from the memory device 100 before or after the suspend command SUSPEND_CMD is output.

The bad block selector 230 may determine the rate of increase in threshold voltage of the threshold voltage distribution of the monitoring memory cells based on the verify data VFY_DATA or the read data READ_DATA. In other words, as the program loops are repeated, the threshold voltage distribution of the monitoring memory cells may increase. The bad block selector 230 may determine the rate of increase in threshold voltage of the threshold voltage distribution of the monitoring memory cells based on the number of turned-on or turned-off memory cells that are determined each time the bad block selector receives the verify data VFY_DATA or the read data READ_DATA.

When the rate of increase in threshold voltage of the threshold voltage distribution exceeds a predetermined reference value, the bad block selector 230 may output a bad block processing command BBS_CMD for processing a memory block with monitoring memory cells as a bad block to the memory device 100. The memory device 100 may process the corresponding memory block as a bad block in response to the bad block processing command BBS_CMD and may no longer perform any operation on the corresponding memory block.

Figure 6:
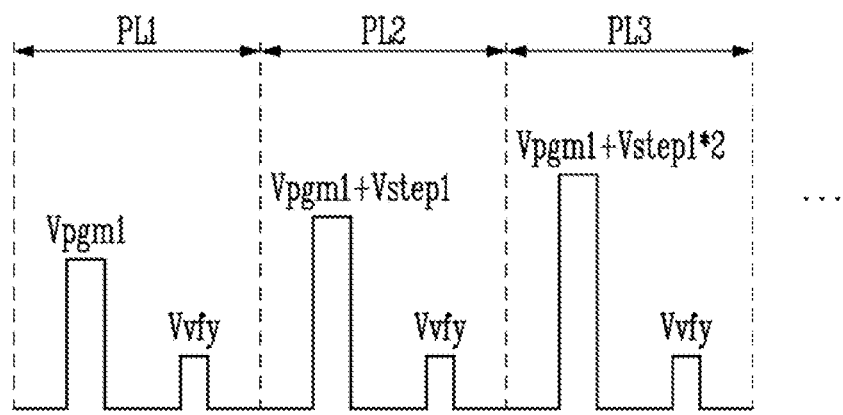
FIG. 6 illustrates program loops performed to program a memory cell.

FIG. 6 illustrates program loops performed to program a memory cell.

Referring to FIG. 6, some of the plurality of program loops which are performed when a selected memory cell, among the plurality of memory cells that are included in the memory device 100 of FIG. 1, is programmed.

According to an embodiment, the memory device 100 of FIG. 1 may perform the plurality of program loops to program the selected memory cell. Each of the program loops may include a program operation and a verify operation. In other words, to program the selected memory cell into a target program state, the memory device 100 of FIG. 1 may apply a program pulse with a magnitude that corresponds to the target program state to the selected memory cell and may apply a verify pulse to a selected word line to check whether the selected memory cell is programmed to the target program state.

According to an embodiment, the memory device 100 of FIG. 1 may perform a first program loop PL1, among the plurality of program loops. To program the selected memory cell into a target program state, the first program loop PL1 may include a program operation that applies a first program voltage Vpgm1 that corresponds to the target program state to the selected word line that is coupled to the selected memory cell, and a verify operation that applies a verify voltage Vvfy to the selected word line.

During a verify operation, it may be determined whether the selected memory cell is programmed to the target program state based on the number of memory cells that are turned on or off.

However, when the selected memory cell is not programmed, the next program loop may be performed. In other words, as a result of performing the first program loop PL1, when the selected memory cell is determined to be not programmed to the target program state, the memory device 100 of FIG. 1 may perform a second program loop PL2 that is the next program loop.

According to an embodiment, the second program loop PL2 may include a program operation that applies a program voltage (Vpgm1+Vstep1), which is greater than the first program voltage Vpgm1 by a first step voltage Vstep1, to the selected word line, and a verify operation that applies the verify voltage Vvfy to the selected word line.

In the same manner as in the first program loop PL1, as a result of performing the second program loop PL2, when the selected memory cell is not programmed to the target program state, the memory device 100 of FIG. 1 may perform a third program loop PL3 that is the next program loop. The third program loop PL3 may include a program operation and a verify operation. During the program operation, a program voltage that is greater than the program voltage (Vpgm1+Vstep1) in the second program loop PL2 by the first step voltage Vstep1, i.e., a program voltage (Vpgm1+Vstep1*2) that is greater than the first program voltage Vpgm1 by two times the first step voltage Vstep1 may be applied to the selected word line.

As described above, the memory device 100 of FIG. 1 may perform a plurality of program loops to program the selected memory cell to the target program state. When each of the program loops is performed, a program operation may be performed by a program voltage that is greater than a program voltage in the previous loop by the first step voltage Vstep1.

As a result of performing a verify operation on a predetermined program loop, when it is determined that the selected memory cell is programmed to the target program state, i.e., when the program passes, the memory device 100 of FIG. 1 may no longer perform the plurality of program loops and terminate the program loops.

However, after all program loops are performed, when it is not determined that the selected memory cell is programmed to the target program state, the memory device 100 of FIG. 1 may output fail information that indicates that the selected memory cell is not programmed to the target program state after processing the program fail to the memory controller 200 of FIG. 1.

In general, when the memory device 100 of FIG. 1 performs the plurality of program loops, the memory device 100 of FIG. 1 may apply a program pulse to a selected word line and then a verify pulse thereto to program the selected memory cell to the target program state in each program loop.

However, in the present disclosure, when the memory device 100 of FIG. 1 performs a plurality of program loops on monitoring memory cells, the memory device 100 of FIG. 1 may output a suspend command at a predetermined time. The memory device 100 of FIG. 1 may suspend the program loops in response to the suspend command.

Hereinafter, the memory controller 200 of FIG. 1 may output a program command again. The memory device 100 of FIG. 1 may perform the plurality of program loops again in response to the program command. In other words, after suspending the plurality of program loops the memory device 100 of FIG. 1 may perform the first program loop PL1 again.

Figure 7:
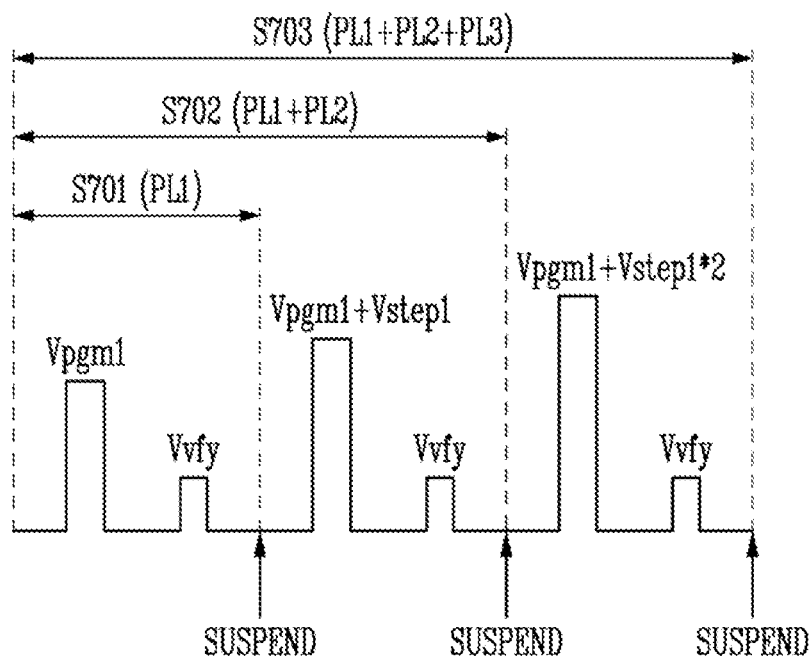
FIG. 7 illustrates loops performed on monitoring memory cells.

FIG. 7 illustrates loops performed on monitoring memory cells.

Referring to FIGS. 6 and 7, FIG. 7 illustrates new program loops by combining the program loops of FIG. 6.

Referring to FIGS. 5 and 7, the program loops of FIG. 7 may refer to program loops performed on monitoring memory cells in response to the program command PGM_CMD of FIG. 5. The monitoring memory cells may refer to memory cells which are coupled to a word line in which severe deterioration is expected to occur, the memory cells being a part of strings that are adjacent to a string that comprises a memory cell on which a program operation or a read operation was performed.

As shown in FIG. 7, it may be assumed that loops S701 to S703 are performed to program the monitoring memory cells and are set beforehand. In another embodiment, more or fewer loops may be performed on the monitoring memory cells.

In addition, as shown in FIG. 7, it may be assumed that the memory device 100 of FIG. 1 performs a program operation based on a triple-level cell (TLC) method. In another embodiment, the memory device 100 of FIG. 1 may perform a program operation based on a single level cell (SLC) method, a multi-level cell (MLC) method, or a quadruple level cell (QLC) method.

According to an embodiment, the memory device 100 of FIG. 1 may perform program loops to program the monitoring memory cells to a highest program state, among the erase state E and the first to seventh program states P1 to P7.

More specifically, the memory device 100 of FIG. 1 may perform the loop S701, among the loops S701 to S703. The loop S701 may be the same program loop as the first program loop PL1 of FIG. 6. The loop S701 may include a program operation that applies the first program voltage Vpgm1 that corresponds to the seventh program state P7 to a word line that is coupled to the monitoring memory cells, and a verify operation that applies the verify voltage Vvfy for verifying whether the monitoring memory cells are programmed.

Contrary to FIG. 6, when the memory device 100 of FIG. 1 completes the loop S701, the memory controller 200 of FIG. 1 may output the suspend command SUSPEND_CMD that suspends the program loops being performed by the memory device 100 of FIG. 1 to the memory device 100 of FIG. 1. When the suspend command SUSPEND_CMD is output, the memory device 100 of FIG. 1 may suspend the program loops being performed in response to the suspend command SUSPEND_CMD.

When the program loops are suspended, the memory controller 200 of FIG. 1 may output the program command PGM_CMD that provides instructions to resume the program loops, starting from the first program loop PL1, to the memory device 100 of FIG. 1. The memory device 100 of FIG. 1 may perform the loop S702 with the first and second program loops PL1 and PL2 in response to the program command PGM_CMD.

More specifically, the first and second program loops PL1 and PL2 may be combined to configure the loop S702. The loop S702 may include the first program loop PL1 and the second program loop PL2 that includes a program operation that applies a program voltage (Vpgm1+Vstep1) that is greater than the first program voltage Vpgm1 by the first step voltage Vstep1 to the word line that is coupled to the monitoring memory cells, and a verify operation that applies the verify voltage Vvfy.

Subsequently, when the memory device 100 of FIG. 1 completes the loop S702, the memory controller 200 of FIG. 1 may output the suspend command SUSPEND_CMD that suspends the program loops being performed by the memory device 100 of FIG. 1 to the memory device 100 of FIG. 1. When the suspend command SUSPEND_CMD is output, the memory device 100 of FIG. 1 may suspend the program loops being performed in response to the suspend command SUSPEND_CMD.

When the program loops are suspended, the memory controller 200 of FIG. 1 may output the program command PGM_CMD that provides instructions to resume the program loops, starting from the first program loop PL1, to the memory device 100 of FIG. 1. The memory device 100 of FIG. 1 may perform the loop S703 including the first to third program loops PL1 to PL3 in response to the program command PGM_CMD.

The loop S703 may include the third program loop PL3 as well as the first and second program loops PL1 and PL2. The third program loop PL3 may include a program operation that applies a program voltage (Vpgm1+Vstep1*2) that is greater than the first program voltage Vpgm1 by two times the first step voltage Vstep1 to the word line that is coupled to the monitoring memory cells, and a verify operation that applies the verify voltage Vvfy.

In FIG. 7, it may be assumed that the program loops S701 to S703 are performed on the monitoring memory cells. Thus, after the loop S703 is performed, when the suspend command SUSPEND_CMD is output from the memory controller 200 of FIG. 1, the memory device 100 of FIG. 1 may terminate the loops that program the monitoring memory cells.

By programming the monitoring memory cells in the above-described manner, a threshold voltage distribution of the monitoring memory cells may be changed. When there is a significant shift in the threshold voltage distribution, a memory block with the monitoring memory cells may be determined as a memory block which is likely to become a bad block. On the other hand, when the threshold voltage distribution is shifted slightly, the memory block with the monitoring memory cells may be determined as a memory block which is unlikely to become a bad block.

Figure 8:
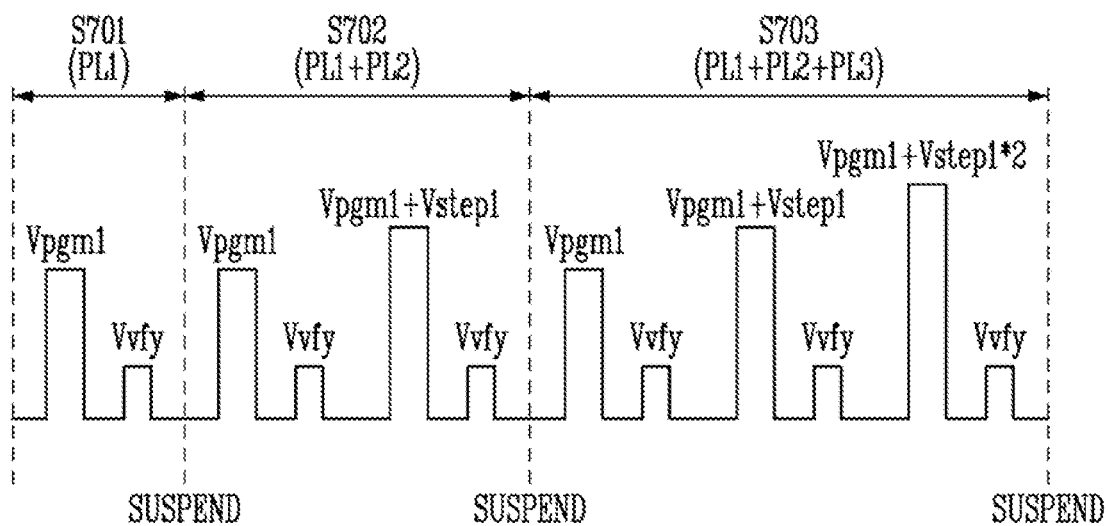
FIG. 8 is a diagram illustrating loops of FIG. 7 according to a time sequence.

FIG. 8 is a diagram illustrating loops of FIG. 7 according to a time sequence.

Referring to FIGS. 7 and 8, FIG. 8 illustrates the loops S701 to S703 performed on the monitoring memory cells of FIG. 7.

According to an embodiment, the loops S701 to S703 may be performed to program the monitoring memory cells to the highest program state. In another embodiment, more or fewer program loops may be performed to program monitoring memory cells.

As described in FIG. 7, the loop S701 may include a program operation that applies the first program voltage Vpgm1 that corresponds to the seventh program state P7 to a word line that is coupled to the monitoring memory cells, and a verify operation that applies the verify voltage Vvfy for verifying whether the monitoring memory cells are programmed.

After the loop S701 is performed, the next loop may be suspended by the suspend command SUSPEND_CMD that is received from the memory controller 200 of FIG. 1. The suspended loop may be resumed by the program command PGM_CMD that is received from the memory controller 200 of FIG. 1.

After receiving the suspend command SUSPEND_CMD, the loop S702 may be performed based on the program command PGM_CMD that is received from the memory controller 200 of FIG. 1. The loop S702 may include the second program loop PL2 as well as the first program loop PL1 that corresponds to the loop S701.

Therefore, in the loop S702, the first program voltage Vpgm1, the verify voltage Vvfy, the program voltage (Vpgm1+Vstep1) that is greater than the first program voltage Vpgm1 by the first step voltage Vstep1, and the verify voltage Vvfy may be sequentially applied to the word line that is coupled to the monitoring memory cells.

After the loop S702 is performed, the program loop may be suspended again by the suspend command SUSPEND_CMD that is received from the memory controller 200 of FIG. 1. The suspended program loop may be resumed by the program command PGM_CMD that is received from the memory controller 200 of FIG. 1.

After the suspend command SUSPEND_CMD is received from the memory controller 200 of FIG. 1, the loop S703 may be performed based on the received program command PGM_CMD. The loop S703 may include the third program loop PL3 as well as the first and second program loops PL1 and PL2 that correspond to the loop S702.

Therefore, in the loop S703, the first program voltage Vpgm1, the verify voltage Vvfy, the program voltage (Vpgm1+Vstep1) that is greater than the first program voltage Vpgm1 by the first step voltage Vstep1, the verify voltage Vvfy, the program voltage (Vpgm1+Vstep1*2) that is greater than the first program voltage Vpgm1 by two times the first step voltage Vstep1, and the verify voltage Vvfy may be sequentially applied to the word line that is coupled to the monitoring memory cells.

After the last verify operation of the loop S703 is performed, the program loop may be suspended again by the suspend command SUSPEND_CMD that is received from the memory controller 200 of FIG. 1. Since all of the predetermined loops S701 to S703 are performed to program the monitoring memory cells, the program of the monitoring memory cells may be terminated, and whether or not to process a memory block as a bad block may be determined based on a rate of increase in threshold voltage of shifting of the threshold voltage distribution of the monitoring memory cells.

Figure 9:
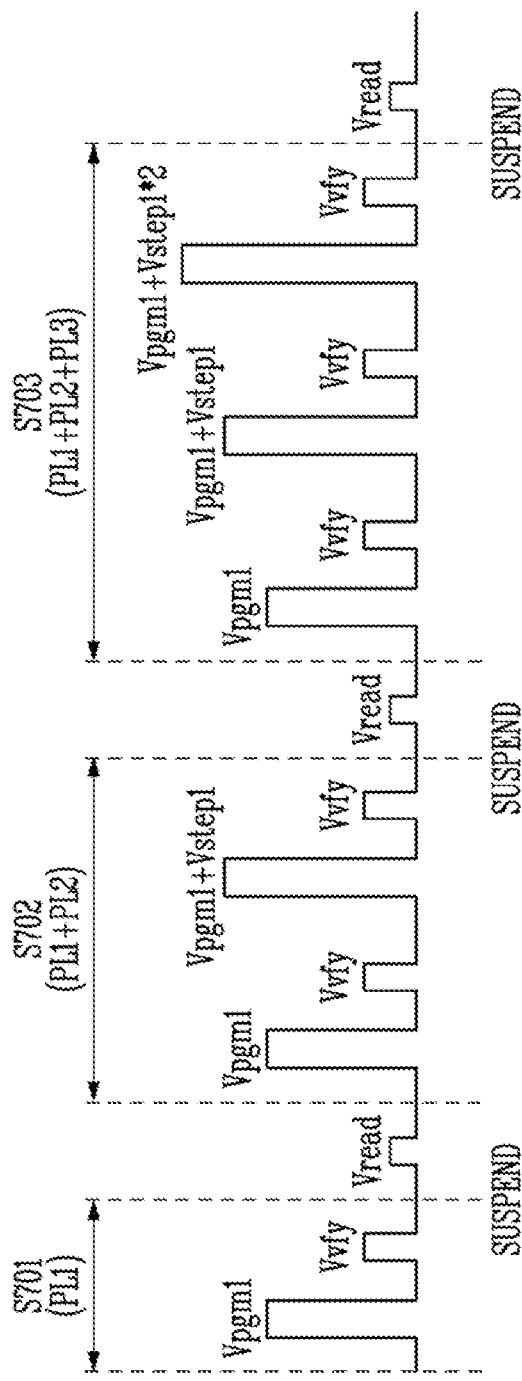
FIG. 9 is a program method of monitoring memory cells where a read operation is added to loops of FIG. 8.

FIG. 9 is a program method of monitoring memory cells where a read operation is added to the loops of FIG. 8.

Referring to FIGS. 8 and 9, FIG. 9 illustrates that a read operation is added after a program loop is suspended in response to the suspend command SUSPEND_CMD.

In FIG. 9, an overlapping description of FIG. 8 will be omitted.

According to an embodiment, after the loop S701 is performed, the program loops may be suspended in response to the suspend command SUSPEND_CMD.

When the program loops are suspended, the memory controller 200 of FIG. 1 may output the read command READ_CMD for checking whether the monitoring memory cells are programmed to the target program state.

Since the monitoring memory cells are programmed to the seventh program state P7 which is the highest, among the erase state E and the first to seventh program states P1 to P7, the memory device 100 of FIG. 1 may perform a read operation on the monitoring memory cells by a read voltage Vread for differentiating the sixth program state P6 and the seventh program state P7 in response to the read command READ_CMD.

The memory device 100 of FIG. 1 may receive the program command PGM_CMD that provides instructions to resume the program loops, starting from the first program loop PL1, from the memory controller 200 of FIG. 1.

After receiving the program command PGM_CMD from the memory controller 200 of FIG. 1, the memory device 100 of FIG. 1 may perform the loop S702 with the first and second program loops PL1 and PL2.

According to an embodiment, after the loop S702 is performed, the program loops being performed may be suspended in response to the suspend command SUSPEND_CMD.

When the program loops are suspended, the memory controller 200 of FIG. 1 may output the read command READ_CMD for checking whether the monitoring memory cells are programmed to the target program state.

In the same manner as the loop S701 is suspended, the memory device 100 of FIG. 1 may perform a read operation on the monitoring memory cells by the read voltage Vread for differentiating the sixth program state P6 and the seventh program state P7 in response to the read command READ_CMD.

The memory device 100 of FIG. 1 may receive the program command PGM_CMD that provides instructions to resume the program loops, starting from the first program loop PL1.

After receiving the program command PGM_CMD from the memory controller 200 of FIG. 1, the memory device 100 of FIG. 1 may perform the loop S703 with the first to third program loops PL1 to PL3.

According to an embodiment, after the loop S703 is performed, the program loops being performed may be suspended in response to the suspend command SUSPEND_CMD.

In the same manner as the loops S701 and S702 are suspended, the memory device 100 of FIG. 1 may perform a read operation on the monitoring memory cells by the read voltage Vread for differentiating the sixth program state P6 and the seventh program state P7 in response to the read command READ_CMD.

According to an embodiment, when a read operation is completed after the loop S703, all the predetermined program loops to program the monitoring memory cells may have been performed so that operations that program the monitoring memory cells may be terminated.

Figure 10:
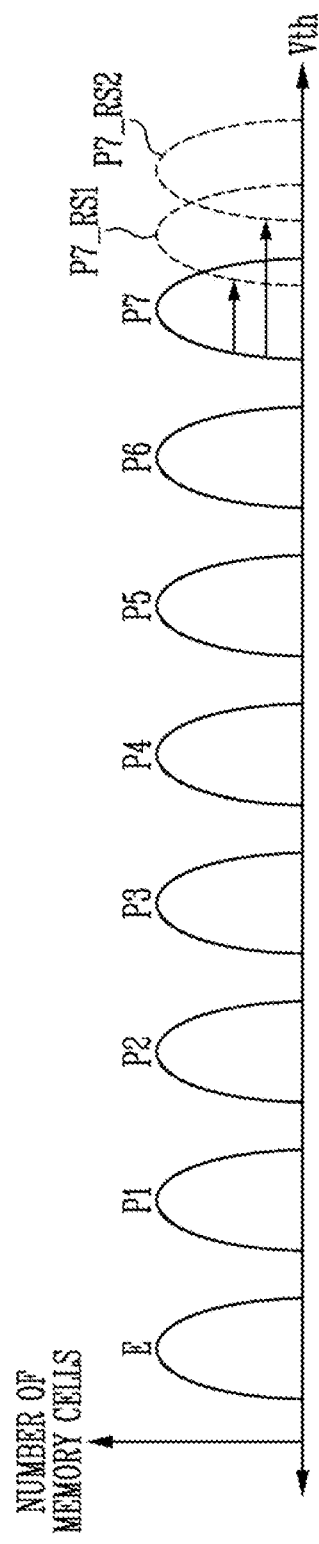
FIG. 10 illustrates variations in threshold voltage distribution of monitoring memory cells.

FIG. 10 illustrates variations in threshold voltage distribution of monitoring memory cells.

Referring to FIGS. 7 to 10, FIG. 10 illustrates a threshold voltage distribution of monitoring memory cells after the loops S701 to S703 on the monitoring memory cells as shown in any one of FIGS. 7 to 9 are performed.

According to an embodiment, when the memory device 100 of FIG. 1 performs a program operation based on a triple-level cell (TLC) method, the monitoring memory cells may be programmed to the seventh program state P7 that is the highest program state, among the erase state E and the first to seventh program states P1 to P7.

However, since the monitoring memory cells are programmed at different rates, when the loops S701 to S703 are performed, as shown in FIGS. 7 to 9, threshold voltages of the monitoring memory cells may increase at different rates.

For example, when a program speed of the monitoring memory cells is low, the threshold voltage distribution of the monitoring memory cells may be shifted to a state P7_RS1. A rate of increase in threshold voltage of the threshold voltage distribution of the monitoring memory cells may be relatively low. When the rate of increase in threshold voltage of the threshold voltage distribution of the monitoring memory cells is low, it may be determined that a memory block with the monitoring memory cells is unlikely to become a bad block.

However, when the program speed of the monitoring memory cells is high, the threshold voltage distribution of the monitoring memory cells may be shifted to a state P7_RS2. The rate of increase in threshold voltage of the threshold voltage distribution of the monitoring memory cells may be relatively high. When the rate of increase in threshold voltage of the threshold voltage distribution of the monitoring memory cells is high, it may be determined that the memory block with the monitoring memory cells is likely to become a bad block.

In addition, when the rate of increase in threshold voltage of the threshold voltage distribution is high, it may mean that the influence of deterioration is high. In other words, the rate of increase in threshold voltage of the threshold voltage distribution may be increased due to the deterioration of neighboring cells during a program operation or disturb deterioration, caused by iterated program or read operations. Therefore, the reliability of the memory block with the monitoring memory cells with the threshold voltage distribution with the high rate of increase may be rapidly reduced due to the deterioration.

Figure 11:
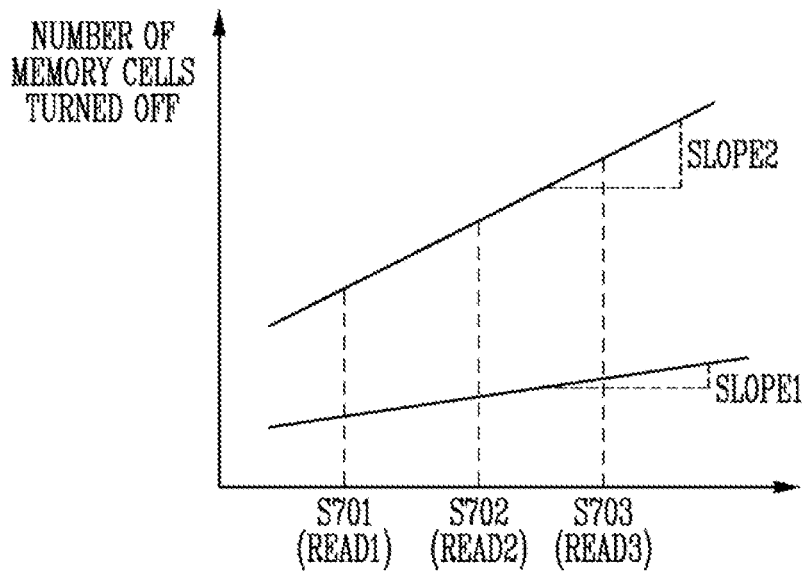
FIG. 11 illustrates a rate of increase in threshold voltage of a threshold voltage distribution of monitoring memory cells.

FIG. 11 illustrates a rate of increase in threshold voltage of a threshold voltage distribution of monitoring memory cells.

Referring to FIGS. 7 to 11, FIG. 11 illustrates a rate of increase in threshold voltage of a threshold voltage distribution determined based on the verify data VFY_DATA which is read during the last verify operation in each loop, or the read data READ_DATA, which is read in response to the read command READ_CMD, which is output after the suspend command SUSPEND_CMD.

Referring to FIGS. 7 and 8, to program the monitoring memory cells to the highest program state, the loops S701 to S703 may be performed. The verify data VFY_DATA that is read during the last verify operation in each loop may be output to the memory controller 200 of FIG. 5.

First, during the verify operation that is included in the loop S701, the memory controller 200 of FIG. 5 may determine the number of memory cells that are turned off, among the monitoring memory cells, based on the read verify data VFY_DATA. During the last verify operation, among the verify operations, included in the loop S702, the memory controller 200 of FIG. 5 may determine the number of memory cells that are turned off, among the monitoring memory cells, based on the read verify data VFY_DATA. In addition, during the last verify operation, among the verify operations that are included in the loop S703, the memory controller 200 of FIG. 5 may determine the number of memory cells that are turned off, among the monitoring memory cells, based on the verify data VFY_DATA.

When the number of memory cells that are turned off is determined based on the verify data VFY_DATA that is read during the last verify operation in each of the loops S701 to S703, the memory controller 200 of FIG. 5 may determine a rate of increase in threshold voltage of a threshold voltage distribution of the monitoring memory cells based on the number of turned-off memory cells.

Referring to FIG. 9, a read operation may also be performed when the loops S701 to S703 are performed on the monitoring memory cells. The read data READ_DATA that is read during each read operation may be output to the memory controller 200 of FIG. 5.

During a first read operation READ1 that is performed after the loop S701 is completed, the memory controller 200 of FIG. 5 may determine the number of memory cells that are turned off, among the monitoring memory cells, based on the read data READ_DATA. During a second read operation READ2 that is performed after the loop S702 is completed, the memory controller 200 of FIG. 5 may determine the number of memory cells that are turned off, among the monitoring memory cells, based on the read data READ_DATA. First, during a third read operation READ3 that is performed after the loop S703 is completed, the memory controller 200 of FIG. 5 may determine the number of memory cells that are turned off, among the monitoring memory cells, based on the read data READ_DATA.

When the number of memory cells that are turned off is determined based on the read data READ_DATA that is read in each read operation, the memory controller 200 of FIG. 5 may determine the rate of increase in threshold voltage of the threshold voltage distribution of the monitoring memory cells based on the number of turned-off memory cells.

According to an embodiment, when the rate of increase in threshold voltage of the threshold voltage distribution determined based on the number of turned-off memory cells, among the monitoring memory cells, is a first slope SLOPE1 that is equal to or less than a reference value, a memory block with the monitoring memory cells may be unlikely to become a bad block.

However, when the rate of increase in threshold voltage of the threshold voltage distribution is a second slope SLOPE2 that exceeds the reference value, the memory block with the monitoring memory cells may be likely to become a bad block. The memory controller 200 of FIG. 5 may process the memory block, which is likely to become a bad block, as a bad block in advance by outputting the bad block processing command BBS_CMD.

Therefore, by processing the memory block with the monitoring memory cells as the bad block based on the rate of increase in threshold voltage of the threshold voltage distribution of the monitoring memory cells, an error that is uncorrectable by error correction code (UECC) may be prevented.

In another embodiment, the number of turned-on memory cells, among the monitoring memory cells, may be determined based on the verify data VFY_DATA that is read during the last verify operation in each of the loops S701 to S703, or the read data READ_DATA that is read during a read operation that is performed together in each of the loops S701 to S703. When the number of turned-on memory cells is determined, the memory controller 200 of FIG. 5 may determine a decrease rate of the threshold voltage distribution of the monitoring memory cells.

According to an embodiment, when the decrease rate of the threshold voltage distribution that is determined based on the number of turned-on memory cells, among the monitoring memory cells, is less than the reference value, the memory block with the monitoring memory cells may be unlikely to become a bad block, and the memory block with the monitoring memory cells may be likely to become the bad block when the decrease rate of the threshold voltage distribution exceeds the reference value. The memory controller 200 of FIG. 5 may process the memory block, which is likely to become a bad block, as a bad block in advance by outputting the bad block processing command BBS_CMD.

Therefore, by processing the memory block with the monitoring memory cells as the bad block based on the decrease rate of the threshold voltage distribution of the monitoring memory cells, generation of errors that are uncorrectable by error correction code (UECC) may be prevented.

Figure 12:
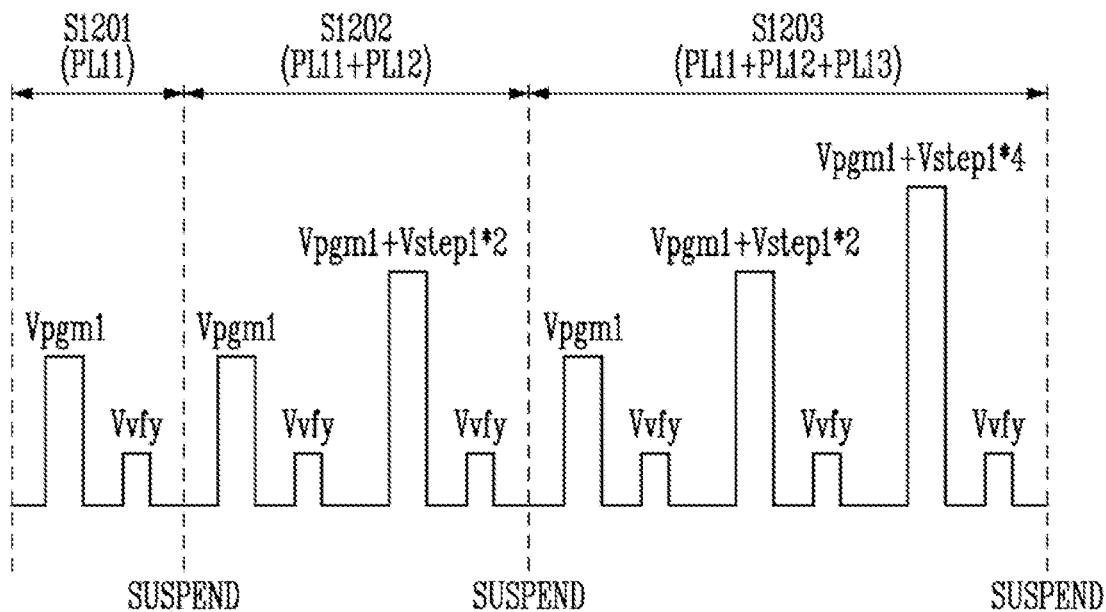
FIG. 12 illustrates an embodiment of loops performed on monitoring memory cells.

FIG. 12 illustrates an embodiment of loops performed on monitoring memory cells.

Referring to FIGS. 8 and 12, FIG. 12 illustrates program loops performed by a step voltage with a different magnitude from the first step voltage Vstep1 of FIG. 8. The magnitude of the step voltage of FIG. 12 may be twice the first step voltage Vstep1. A program voltage may be increased by the step voltage that is greater than the first step voltage Vstep1 of FIG. 8 in each loop.

According to an embodiment, loops S1201 to S1203 may be performed on the monitoring memory cells. The loops S1201 to S1203 may be the same as the loops S701 to S703 of FIG. 8, except for the magnitude of the step voltage.

According to an embodiment, the loop S1201 may include a program operation that applies the first program voltage Vpgm1 that corresponds to the seventh program state P7 to a word line that is coupled to the monitoring memory cells, and a verify operation that applies the verify voltage Vvfy for verifying whether the monitoring memory cells are programmed.

Referring to FIG. 8, the loop S1201 may be the same as the loop S701 of FIG. 8.

After the loop S1201 is performed, the next loop may be suspended by the suspend command SUSPEND_CMD that is received from the memory controller 200 of FIG. 1. The suspended loop may be resumed by the program command PGM_CMD that is received from the memory controller 200 of FIG. 1.

After receiving the suspend command SUSPEND_CMD, the loop S1202 may be performed based on the program command PGM_CMD that is received from the memory controller 200 of FIG. 1. The loop S1202 may include a 12th program loop PL12 as well as a 11th program loop PL11 that corresponds to the loop S1201. The 12th program loop PL12 may include a program operation that applies a program voltage (Vpgm1+Vstep1*2) that is greater than the first program voltage Vpgm1 by two times the first step voltage Vstep1 to the word line that is coupled to monitoring memory cells, and a verify operation that applies the verify voltage Vvfy.

In other words, contrary to the loop S702 of FIG. 8, after the first program voltage Vpgm1 and the verify voltage Vvfy are applied to the word line that is coupled to the monitoring memory cells, the program voltage (Vpgm1+Vstep1*2) that is greater than the first program voltage Vpgm1 by two times the first step voltage Vstep1, and the verify voltage Vvfy may be sequentially applied thereto.

After the loop S1202 is performed, the loop may be suspended by the suspend command SUSPEND_CMD that is received from the memory controller 200 of FIG. 1. The suspended loop may be resumed by the program command PGM_CMD that is received from the memory controller 200 of FIG. 1.

After receiving the suspend command SUSPEND_CMD, the loop S1203 may be performed based on the program command PGM_CMD that is received from the memory controller 200 of FIG. 1. The loop S1203 may include a 13th program loop PL13 as well as the 11th and 12th program loops PL11 and PL12 that correspond to the loop S1202.

In other words, unlike the loop S703 of FIG. 8, in the loop S1203, after the first program voltage Vpgm1 and the verify voltage Vvfy are applied to the word line that is coupled to the monitoring memory cells, the program voltage (Vpgm1+Vstep1*2) that is greater than the first program voltage Vpgm1 by two times the first step voltage Vstep1 and the verify voltage Vvfy, and a program voltage (Vpgm1+Vstep1*4) that is greater than the first program voltage Vpgm1 by a quadruple of the first step voltage Vstep1 and the verify voltage Vvfy may be sequentially applied thereto.

Therefore, in comparison with that of FIG. 8, a program voltage may be increased to a different magnitude as shown in FIG. 12.

Though not shown in FIG. 12, referring to FIG. 9, when the loops S1201 to S1203 are suspended, the memory controller 200 of FIG. 1 may output the read command READ_CMD to check whether the monitoring memory cells are programmed to the target program state to the memory device 100 of FIG. 1.

In response to the read command READ_CMD that is output after each of the loops S1201 to S1203 is suspended, the memory device 100 of FIG. 1 may perform a read operation on the monitoring memory cells by the read voltage Vread for differentiating the sixth program state P6 and the seventh program state P7.

After the last verify operation of the loop S1203, when the suspend command SUSPEND_CMD is received from the memory controller 200 of FIG. 1, or a read operation that corresponds to the read command READ_CMD received after the suspend command SUSPEND_CMD is received is performed, the program of the monitoring memory cells may be terminated, and whether or not to process the corresponding memory block as a bad block may be determined based on a rate of increase in threshold voltage of shifting of the threshold voltage distribution of the monitoring memory cells.

Figure 13:
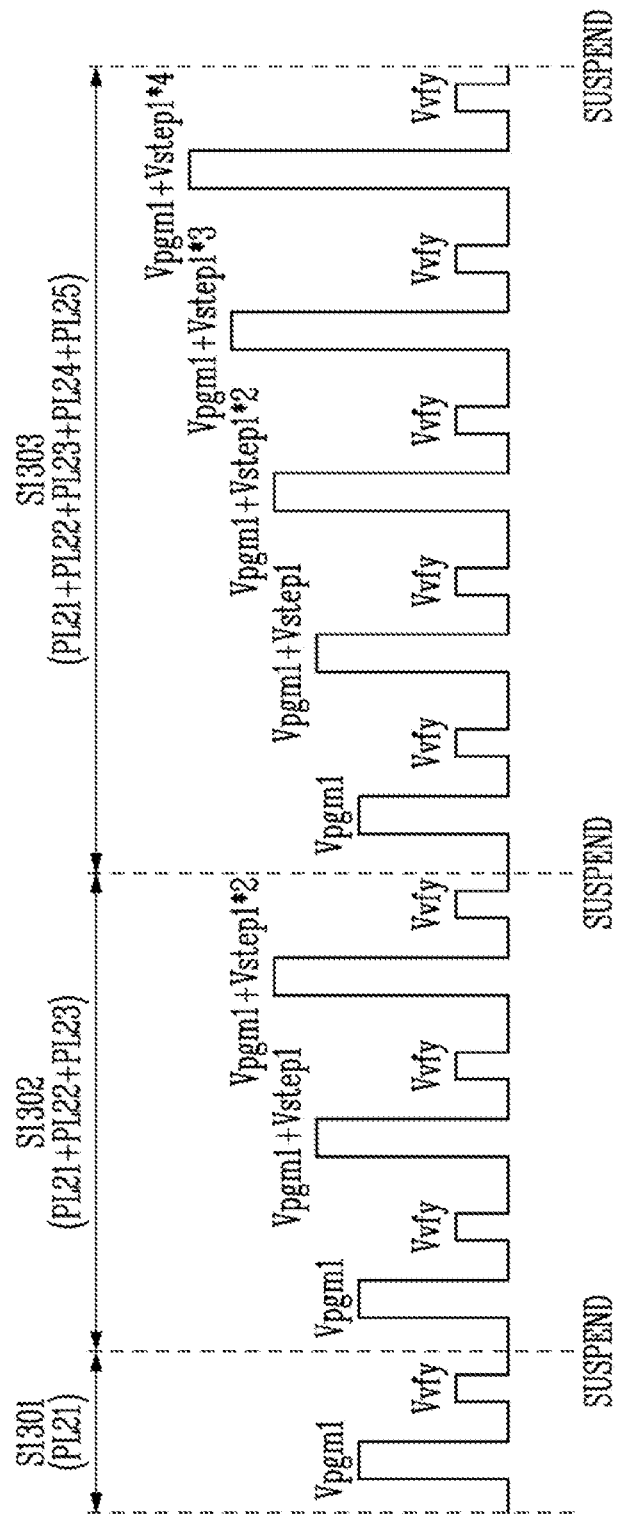
FIG. 13 illustrates an embodiment of loops performed on monitoring memory cells.

FIG. 13 illustrates an embodiment of loops performed on monitoring memory cells.

Referring to FIGS. 8 and 13, FIG. 13 illustrates a method of programming monitoring memory cells by changing the number of program operations and the number of verify operations performed in the loops S701 to S703 of FIG. 8, i.e., by changing the number of program loops that are included in each loop.

According to an embodiment, loops S1301 to S1303 may be performed on the monitoring memory cells. The loops S1301 to S1303 may be the same as the loops S701 to S703, except for the number of program operations and the number of verify operations that are performed in the loops S701 to S703, i.e., the number of program loops in each loop.

According to an embodiment, the loop S1301 may include a program operation that applies the first program voltage Vpgm1 that corresponds to the seventh program state P7 to a word line that is coupled to the monitoring memory cells, and a verify operation that applies the verify voltage Vvfy for verifying whether the monitoring memory cells are programmed.

Referring to FIG. 8, the loop S1301 may be the same as the loop S701 of FIG. 8.

After the loop S1301 is performed, the next loop may be suspended by the suspend command SUSPEND_CMD that is received from the memory controller 200 of FIG. 1. The suspended loop may be resumed by the program command PGM_CMD that is received from the memory controller 200 of FIG. 1.

After receiving the suspend command SUSPEND_CMD, the loop S1302 may be performed based on the program command PGM_CMD that is received from the memory controller 200 of FIG. 1. The loop S1302 may include a 22nd program loop PL22 and a 23rd program loop PL23 as well as a 21st program loop PL21 that corresponds to the loop S1301. In the 22nd and 23rd program loops PL22 and PL23, a program voltage may be increased by the first step voltage Vstep1.

More specifically, the 22nd program loop PL22 may include a program operation that applies a program voltage (Vpgm1+Vstep1) that is greater than the first program voltage Vpgm1 by the first step voltage Vstep1 to the word line that is coupled to monitoring memory cells, and a verify operation that applies the verify voltage Vvfy thereto. The 23rd program loop PL23 may include a program operation that applies a program voltage (Vpgm1+Vstep1*2) that is greater than the first program voltage Vpgm1 by two times the first step voltage Vstep1 to the word line that is coupled to monitoring memory cells, and a verify operation that applies the verify voltage Vvfy.

In other words, unlike the loop S702 of FIG. 8, in the loop S1302, after the first program voltage Vpgm1 and the verify voltage Vvfy are applied to the word line that is coupled to the monitoring memory cells, the program voltage (Vpgm1+Vstep1) that is greater than the first program voltage Vpgm1 by the first step voltage Vstep1 and the verify voltage Vvfy, and the program voltage (Vpgm1+Vstep1*2) that is greater than the first program voltage Vpgm1 by two times the first step voltage Vstep1 and the verify voltage Vvfy may be sequentially applied thereto.

After the loop S1302 is performed, the program loop may be suspended by the suspend command SUSPEND_CMD that is received from the memory controller 200 of FIG. 1. The suspended loop may be resumed by the program command PGM_CMD that is received from the memory controller 200 of FIG. 1.

After receiving the suspend command SUSPEND_CMD, the loop S1303 may be performed based on the program command PGM_CMD that is received from the memory controller 200 of FIG. 1. The loop S1303 may include a 24th program loop PL24 and a 25th program loop PL25 as well as the 21st to 23rd program loops PL21 to PL23 that correspond to the loop S1302. In the 24th and 25th program loops PL24 and PL25, a program voltage may be increased by the first step voltage Vstep1.

More specifically, unlike the loop S703 of FIG. 8, in the loop S1303, after the first program voltage Vpgm1 and the verify voltage Vvfy are applied to the word line that is coupled to the monitoring memory cells, the program voltage (Vpgm1+Vstep1) that is greater than the first program voltage Vpgm1 by the first step voltage Vstep1 and the verify voltage Vvfy, and the program voltage (Vpgm1+Vstep1*2) that is greater than the first program voltage Vpgm1 by two times the first step voltage Vstep1 and the verify voltage Vvfy, and a program voltage (Vpgm1+Vstep1*3) that is greater than the first program voltage Vpgm1 by three times the first step voltage Vstep1 and the verify voltage Vvfy, and a program voltage (Vpgm1+Vstep1*4) which is greater than the first program voltage Vpgm1 by four times the first step voltage Vstep1 and the verify voltage Vvfy may be sequentially applied thereto.

Though not shown in FIG. 13, referring to FIG. 9, when the loops S1301 to S1303 are suspended, the memory controller 200 of FIG. 1 may output the read command READ_CMD to check whether the monitoring memory cells are programmed to the target program state to the memory device 100 of FIG. 1.

In response to the read command READ_CMD that is output after each of the loops S1301 to S1303 is suspended, the memory device 100 of FIG. 1 may perform a read operation on the monitoring memory cells by the read voltage Vread for differentiating the sixth program state P6 and the seventh program state P7.

After the last verify operation of the loop S1303, when the suspend command SUSPEND_CMD is received from the memory controller 200 of FIG. 1, or a read operation that corresponds to the read command READ_CMD received after the suspend command SUSPEND_CMD is received is performed, the program of the monitoring memory cells may be terminated, and whether or not to process the corresponding memory block as a bad block may be determined based on a rate of increase in threshold voltage of shifting of the threshold voltage distribution of the monitoring memory cells.

Figure 14:
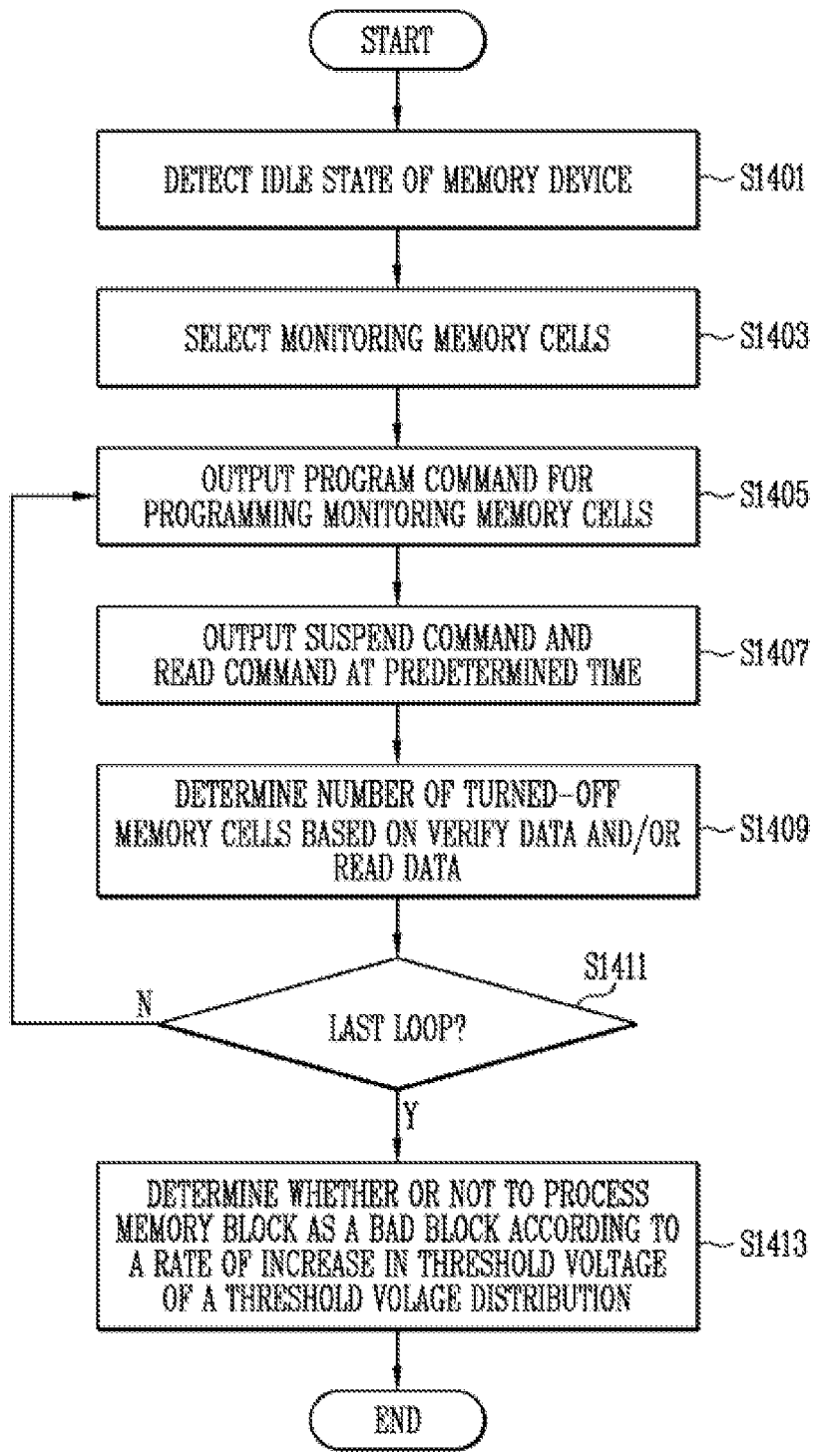
FIG. 14 is a diagram illustrating operations of a memory controller according to an embodiment of the present disclosure.

FIG. 14 is a diagram illustrating operations of a memory controller according to an embodiment of the present disclosure.

Referring to FIG. 14, at step S1401, the memory controller may detect an idle state of a memory device. The idle state of the memory device may refer to a state in which the memory device does not perform any operation for a predetermine time.

At step S1403, the memory controller may select monitoring memory cells. More specifically, the memory controller may determine neighboring strings that are coupled to bit lines that are adjacent to a bit line that is coupled to a memory cell on which a program operation or a read operation was performed before the idle state of the memory device is detected and may select memory cells in which severe deterioration is expected to occur, the memory cells being a part of the determined neighboring strings, as monitoring memory cells.

At step S1405, the memory controller may output a program command to program the monitoring memory cells to the memory device. The program command may refer to a command that provides instructions to program the monitoring memory cells to a highest program state.

For example, when the memory device programs memory cells by a triple-level cell (TLC) method, the program command may be a command that provides instructions to program the monitoring memory cells to the seventh program state P7 which is the highest program state, among the erase state E and the first to seventh program states P1 to P7.

The memory device may perform a plurality of loops to program the monitoring memory cells in response to the program command. Each of the plurality of loops may include one or more program loops, and each of the program loops may include a program operation and a verify operation. The number of loops and the number of program loops that are included in each of the loops may be determined so as to program the monitoring memory cells.

At step S1407, the memory controller may output a suspend command that suspends the program loops being performed on the memory device at a predetermined time. The predetermined time may refer to a time at which the number of program loops that are performed by the memory device is increased.

For example, when the memory device performs one program loop, the memory controller may output the suspend command. When the plurality of loops are suspended in response to the suspend command and resumed, the memory controller may output a suspend command when the memory device performs two program loops. When the plurality of loops are suspended in response to the suspend command and resumed, the memory controller may output a suspend command when the memory device performs three program loops.

In another example, when the memory device performs one program loop, the memory controller may output a suspend command. When a plurality of loops are suspended in response to the suspend command and resumed, the memory controller may output a suspend command when the memory device performs three program loops. When the plurality of loops are suspended in response to the suspend command and resumed, the memory controller may output a suspend command when the memory device performs five program loops.

Further, when a rate of increase in threshold voltage of a threshold voltage distribution of the monitoring memory cells is determined by an additional read operation after the plurality of loops are suspended in response to the suspend command, the memory controller may additionally output a read command after outputting the suspend command. A read operation that corresponds to the read command may be performed by a read voltage for differentiating the highest program state from a program state that is adjacent to the highest program state.

At step S1409, the memory controller may determine the number of turned-off memory cells based on verify data and/or read data. The verify data may refer to data that is read during the last verify operation that is performed before the suspend command is output, and the read data may refer to data that is read during the read operation that corresponds to the read command which is output after the suspend command is output.

At step S1411, the memory controller may determine whether a loop that is performed before the suspend command is output is the last loop. When it is determined as the last loop, among the plurality of loops (Y), the process may proceed to step S1413. However, when it is not the last loop, among the plurality of loops (N), the process may proceed to step S1405, the memory controller may output a program command for resuming the plurality of loops. When the plurality of loops are resumed, the plurality of loops may be resumed, starting from the first program loop.

At step S1413, the memory controller may determine whether not to process a memory block with the monitoring memory cells as a bad block according to the rate of increase in threshold voltage of the threshold voltage distribution that is determined based on the number of turned-off memory cells.

For example, when the rate of increase in threshold voltage of the threshold voltage distribution of the monitoring memory cells is less than or equal to a reference value, it may be determined that the memory block with the monitoring memory cells is unlikely to become a bad block. Therefore, when the rate of increase in threshold voltage of the threshold voltage distribution is less than or equal to the reference value, the memory controller may not process the memory block with the monitoring memory cells as a bad block.

Therefore, when the rate of increase in threshold voltage of the threshold voltage distribution exceeds the reference value, it may be determined that the memory block with the monitoring memory cells is likely to become a bad block. Therefore, when the rate of increase in threshold voltage of the threshold voltage distribution exceeds the reference value, the memory controller may process the memory block with the monitoring memory cells as a bad block.

Figure 15:
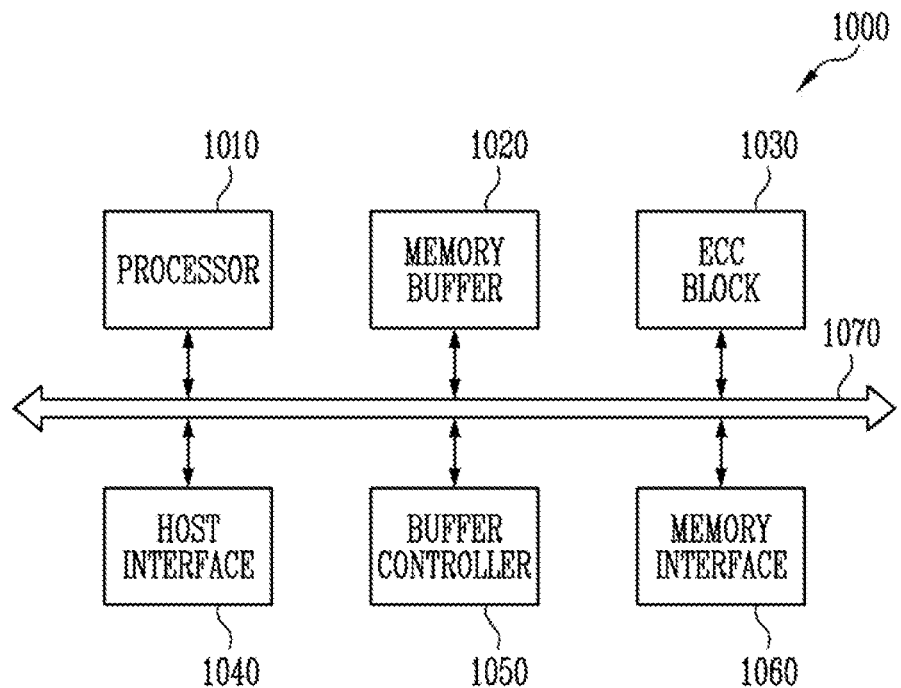
FIG. 15 is a diagram illustrating another embodiment of a memory controller of FIG. 1.

FIG. 15 is a diagram illustrating another embodiment of the memory controller of FIG. 1.

A memory controller 1000 may be coupled to a host and a memory device. In response to a request from the host, the memory controller 1000 may access the memory device. For example, the memory controller 1000 may control write, read, erase, and background operations of the memory device. The memory controller 1000 may provide an interface between the memory device and the host. The memory controller 1000 may drive firmware for controlling the memory device.

Referring to FIG. 15, the memory controller 1000 may include a processor 1010, a memory buffer 1020, an error correction code (ECC) block 1030, a host interface 1040, a buffer control circuit 1050, a memory interface 1060, and a bus 1070.

The bus 1070 may provide a channel between components of the memory controller 1000.

The processor 1010 may control the overall operation of the memory controller 1000 and may perform a logical operation. The processor 1010 may communicate with an external host through the host interface 1040 and communicate with the memory device through the memory interface 1060. Further, the processor 1010 may communicate with the memory buffer 1020 through the buffer control circuit 1050. The processor 1010 may control operations of the storage device by using the memory buffer 1020 as a working memory, a cache memory or a buffer memory.

The processor 1010 may perform the function of a flash translation layer (FTL). The processor 1010 may translate a logical block address LBA, provided by the host, into a physical block address PBA through the flash translation layer FTL. The flash translation layer FTL may receive the logical block address LBA and translate the logical block address LBA into the physical block address PBA by using a mapping table. There may be various address mapping methods for the flash translation layer FTL, depending on a mapping unit. Typical address mapping methods may include a page mapping method, a block mapping method and a hybrid mapping method.

The processor 1010 may randomize data that is received from the host. For example, the processor 1010 may use a randomizing seed to randomize data that is received from the host. The randomized data may be provided, as data to be stored, to the memory device and may be programmed in the memory cell array.

The processor 1010 may run software or firmware to perform randomizing and derandomizing operations.

The memory buffer 1020 may serve as an operation memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC block 1030 may perform error correction. The ECC block 1030 may perform ECC encoding based on data to be written to the memory device through the memory interface 1060. The ECC-encoded data may be transferred to the memory device through the memory interface 1060. The ECC block 1030 may perform ECC decoding based on data that is received from the memory device through the memory interface 1060. For example, the ECC block 1030 may be included as the component of the memory interface 1060 in the memory interface 1060.

The host interface 1040 may communicate with the external host in response to the processor 1010. The host interface 1040 may communicate with the external host using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 in response to the processor 1010.

The memory interface 1060 may communicate with the memory device in response to the processor 1010. The memory interface 1060 may transmit/receive commands, addresses, and data to/from the memory device through channels.

For example, the memory controller 1000 may not include the memory buffer 1020 and the buffer control circuit 1050.

For example, the processor 1010 may control the operations of the memory controller 1000 using codes. The processor 1010 may load codes from a nonvolatile memory device (e.g., ROM) provided in the memory controller 1000. In another example, the processor 1010 may load codes from the memory device through the memory interface 1060.

For example, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other and may neither interfere with nor influence each other. The data bus may be coupled to the host interface 1040, the buffer control circuit 1050, the ECC block 1030, and the memory interface 1060.

The control bus may be coupled to the host interface 1040, the processor 1010, the buffer control circuit 1050, the memory buffer 1020, and the memory interface 1060.

According to an embodiment, the processor 1010 may determine neighboring strings that are adjacent to a string that comprises a memory cell on which a program operation or a read operation was performed, among the memory cells that are included in the memory device 100 of FIG. 1. In addition, the processor 1010 may select memory cells that are coupled to a predetermined word line, among memory cells of the determined neighboring strings, as monitoring memory cells.

When the monitoring memory cells are selected, the processor 1010 may control the memory device 100 of FIG. 1 to perform a plurality of loops that program the monitoring memory cells into a highest program state. Each of the plurality of loops may include at least one program loop, and the number of program loops included in each loop may vary. In addition, each program loop may include one program operation and one verify operation.

According to an embodiment, when the plurality of loops are performed on the monitoring memory cells, the processor 1010 may output a suspend command at a predetermined time. The predetermined time may refer to a time at which the number of program loops performed on the memory device 100 of FIG. 1 to program the monitoring memory cells is increased.

For example, when one program loop to program the monitoring memory cells is performed, the processor 1010 may output a suspend command. When the plurality of loops are suspended in response to the suspend command and then resumed, the processor 1010 may output a suspend command after two program loops are performed. In other words, the suspend command may be output when the number of program loops performed on the memory device 100 of FIG. 1 is increased.

According to an embodiment, after the suspend command is output, the processor 1010 may additionally output a read command. A read operation that corresponds to the read command may be performed by a read voltage for differentiating the highest program state from a program state adjacent to the highest program state so as to check whether the monitoring memory cells are programmed to the highest program state.

In another embodiment, the processor 1010 may not additionally output the read command after the suspend command is output.

After the suspend command or the read command is output, the processor 1010 may determine the number of memory cells that are turned off based on verify data that is read during the last verify operation before the suspend command is output, or read data that is read during a read operation that corresponds to the read command.

According to an embodiment, when the last loop, among the plurality of loops, is not performed, the processor 1010 may output a program command for resuming the suspended loops to the memory device 100 of FIG. 1. In other words, suspension and resumption of the plurality of loops may be repeated until the last loop, among the plurality of loops that are performed to program the monitoring memory cells, is performed.

According to an embodiment, after the last loop, among the plurality of loops, is performed, when the suspend command or the read command is output and the number of memory cells that are turned off is determined, the processor 1010 may determine a rate of increase in threshold voltage of a threshold voltage distribution based on turned-off memory cells. The processor 1010 may determine whether or not to process a memory block with the monitoring memory cells as a bad block according to the rate of increase in threshold voltage of the threshold voltage distribution.

For example, when the rate of increase in threshold voltage of the threshold voltage distribution of the monitoring memory cells is less than or equal to a reference value, the memory block with the monitoring memory cells may not be processed as a bad block. However, when the rate of increase in threshold voltage of the threshold voltage distribution exceeds the reference value, the memory block with the monitoring memory cells may be processed as a bad block.

Figure 16:
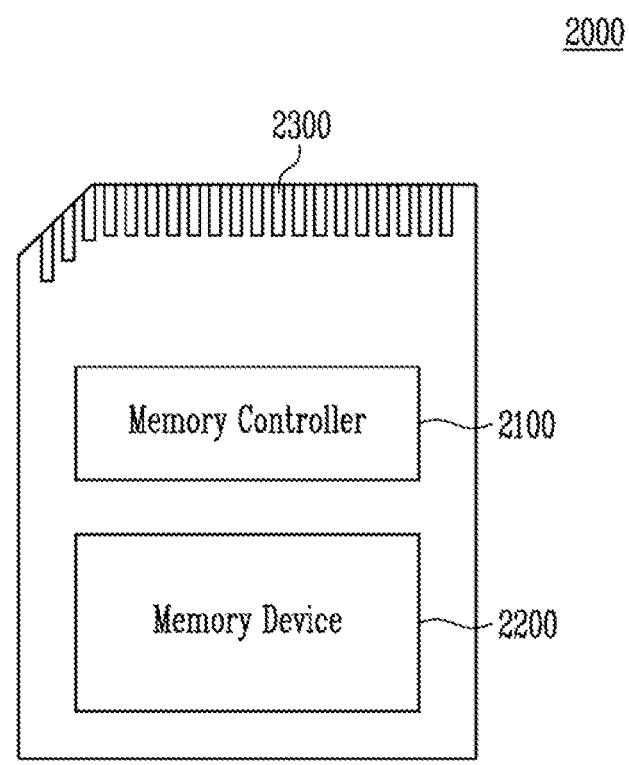
FIG. 16 is a block diagram illustrating a memory card system to which a storage device according to an embodiment is applied.

FIG. 16 is a block diagram illustrating a memory card system 2000 to which a storage device according to an embodiment is applied.

Referring to FIG. 16, the memory card system 2000 may include a memory controller 2100, a memory device 2200 and a connector 2300.

The memory controller 2100 may be coupled to the memory device 2200. The memory controller 2100 may access the memory device 2200. For example, the memory controller 2100 may control read, write, erase, and background operations of the memory device 2200. The memory controller 2100 may be configured to provide an interface between the memory device 2200 and the host. The memory controller 2100 may be configured to drive firmware for controlling the memory device 2200. The memory device 2200 may be realized in the same manner as the memory device 100 as described above with reference to FIG. 1.

In an embodiment, the memory controller 2100 may include components, such as a Random Access Memory (RAM), a processing unit, a host interface, a memory interface, and an ECC block.

The memory controller 2100 may communicate with an external device through the connector 2300. The memory controller 2100 may communicate with an external device (e.g., host) based on a specific communication protocol. For example, the memory controller 2100 may communicate with the external device through at least one of various communication protocols, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) protocols. For example, the connector 2300 may be defined by at least one of the above-described various communication protocols.

In an embodiment, the memory device 2200 may be embodied as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), and a Spin-Torque Magnetic RAM (STT-MRAM).

The memory controller 2100 and the memory device 2200 may be integrated into a single semiconductor device to form a memory card. For example, the memory controller 2100 and the memory device 2200 may be integrated into a single semiconductor device and form a memory card, such as a personal computer memory card international association (PCMCIA), a compact flash card (CF), a smart media card (SM or SMC), a memory stick multimedia card (MMC, RS-MMC, or MMCmicro), an SD card (SD, miniSD, microSD, or SDHC), a universal flash storage (UFS), and the like.

According to an embodiment, the memory controller 2100 may determine neighboring strings that are adjacent to a string that comprises a memory cell on which a program operation or a read operation was performed, among memory cells that are included in the memory device 2200. In addition, the memory controller 2100 may select memory cells that are coupled to a predetermined word line, among memory cells of the determined neighboring strings, as monitoring memory cells.

When the monitoring memory cells are selected, the memory controller 2100 may control the memory device 2200 to perform a plurality of loops that program the monitoring memory cells into a highest program state. Each of the plurality of loops may include at least one program loop, and the number of program loops included in each loop may vary. In addition, each program loop may include one program operation and one verify operation.

According to an embodiment, when the plurality of loops are performed on the monitoring memory cells, the memory controller 2100 may output a suspend command at a predetermined time. The predetermined time may refer to a time at which the number of program loops performed on the memory device 2200 to program the monitoring memory cells is increased.

For example, when one program loop to program the monitoring memory cells is performed, the memory controller 2100 may output a suspend command. When the plurality of loops are suspended in response to the suspend command and then resumed, the memory controller 2100 may output a suspend command after two program loops are performed. In other words, the suspend command may be output when the number of program loops performed on the memory device 2200 is increased.

According to an embodiment, after the suspend command is output, the memory controller 2100 may additionally output a read command. A read operation that corresponds to the read command may be performed by a read voltage for differentiating the highest program state from a program state adjacent to the highest program state so as to check whether the monitoring memory cells are programmed to the highest program state.

In another embodiment, the memory controller 2100 may not additionally output the read command after the suspend command is output.

After the suspend command or the read command is output, the memory controller 2100 may determine the number of memory cells that are turned off based on verify data that is read during the last verify operation before the suspend command is output, or read data that is read during a read operation that corresponds to the read command.

According to an embodiment, when the last loop, among the plurality of loops, is not performed, the memory controller 2100 may output a program command to resume the suspended loops to the memory device 2200. In other words, suspension and resumption of the plurality of loops may be repeated until the last loop, among the plurality of loops that are performed to program the monitoring memory cells, is performed.

According to an embodiment, after the last loop, among the plurality of loops, is performed, when the suspend command or the read command is output and the number of memory cells that are turned off is determined, the memory controller 2100 may determine a rate of increase in threshold voltage of a threshold voltage distribution based on turned-off memory cells. The memory controller 2100 may determine whether or not to process a memory block with the monitoring memory cells as a bad block according to the rate of increase in threshold voltage of the threshold voltage distribution.

For example, when the rate of increase in threshold voltage of the threshold voltage distribution of the monitoring memory cells is less than or equal to a reference value, the memory block with the monitoring memory cells may not be processed as a bad block. However, when the rate of increase in threshold voltage of the threshold voltage distribution exceeds the reference value, the memory block with the monitoring memory cells may be processed as a bad block.

Figure 17:
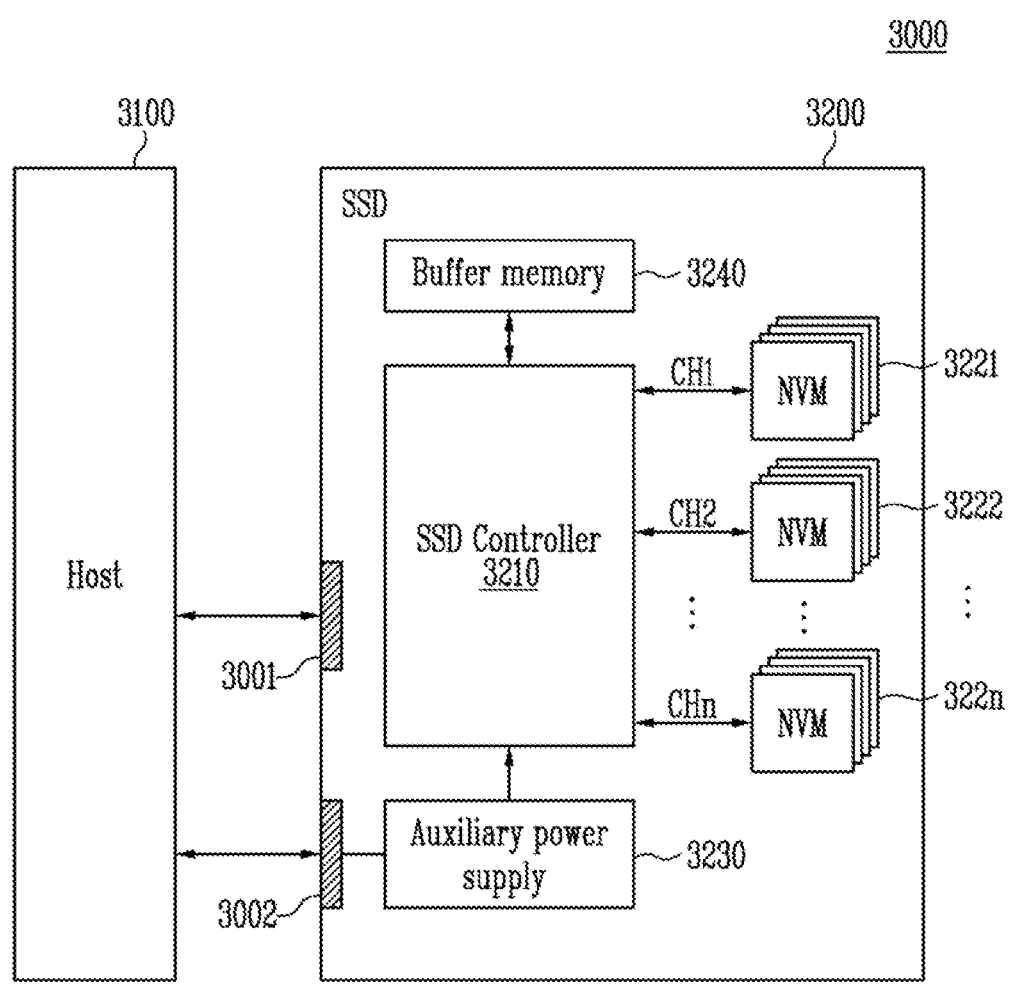
FIG. 17 is a block diagram illustrating an example of a solid state drive (SSD) system to which a storage device according to an embodiment is applied.

FIG. 17 is a block diagram illustrating an example of a solid state drive (SSD) system 3000 to which a storage device according to an embodiment is applied.

Referring FIG. 17, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. According to an embodiment, the signals SIG may be defined based on the interfaces of the host 3100 and the SSD 3200. According to an embodiment, the signals SIG may be signals based on the interfaces of the host 3100 and the SSD 3200. For example, the signals SIG may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces.

The auxiliary power supply 3230 may be coupled to the host 3100 through the power connector 3002. The auxiliary power supply 3230 may be supplied and charged with the power PWR from the host 3100. The auxiliary power supply 3230 may supply the power of the SSD 3200 when power is not smoothly supplied from the host 3100. For example, the auxiliary power supply 3230 may be positioned inside or outside the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data that is received from the host 3100 or data that is received from the plurality of flash memories 3221 to 322n, or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

According to an embodiment, the SSD controller 3210 may determine neighboring strings that are adjacent to a string that comprises a memory cell, among memory cells that are included in the plurality of flash memories 3221 to 322n, on which a program operation or a read operation was performed. In addition, the SSD controller 3210 may select memory cells coupled to a predetermined word line, among memory cells of the determined neighboring strings, as monitoring memory cells.

When the monitoring memory cells are selected, the SSD controller 3210 may control the flash memories 3221 to 322n to perform a plurality of loops that program the monitoring memory cells to a highest program state. Each of the plurality of loops may include at least one program loop, and the number of program loops included in each loop may vary. In addition, each program loop may include one program operation and one verify operation.

According to an embodiment, when the plurality of loops are performed on the monitoring memory cells, the SSD controller 3210 may output a suspend command at a predetermined time. The predetermined time may refer to a time at which the number of program loops performed on the flash memories 3221 to 322n to program the monitoring memory cells is increased.

For example, when one program loop to program the monitoring memory cells is performed, the SSD controller 3210 may output a suspend command. When the plurality of loops are suspended in response to the suspend command and then resumed, the SSD controller 3210 may output a suspend command after two program loops are performed. In other words, the suspend command may be output when the number of program loops performed on the flash memories 3221 to 322n is increased.

According to an embodiment, after the suspend command is output, the SSD controller 3210 may additionally output a read command. A read operation that corresponds to the read command may be performed by a read voltage for differentiating the highest program state from a program state adjacent to the highest program state so as to check whether the monitoring memory cells are programmed to the highest program state.

In another embodiment, the SSD controller 3210 may not additionally output the read command after the suspend command is output.

After the suspend command or the read command is output, the SSD controller 3210 may determine the number of memory cells that are turned off based on verify data that is read during the last verify operation before the suspend command is output, or read data that is read during a read operation that corresponds to the read command.

According to an embodiment, when the last loop, among the plurality of loops, is not performed, the SSD controller 3210 may output a program command for resuming the suspended loops to the flash memories 3221 to 322n. In other words, suspension and resumption of the plurality of loops may be repeated until the last loop, among the plurality of loops, performed to program the monitoring memory cells is performed.

According to an embodiment, after the last loop, among the plurality of loops, is performed, when the suspend command or the read command is output and the number of turned-off memory cells is determined, the SSD controller 3210 may determine a rate of increase in threshold voltage of a threshold voltage distribution based on turned-off memory cells. The SSD controller 3210 may determine whether or not to process a memory block with the monitoring memory cells as a bad block according to the rate of increase in threshold voltage of the threshold voltage distribution.

For example, when the rate of increase in threshold voltage of the threshold voltage distribution of the monitoring memory cells is less than or equal to a reference value, the memory block with the monitoring memory cells may not be processed as a bad block. However, when the rate of increase in threshold voltage of the threshold voltage distribution exceeds the reference value, the memory block with the monitoring memory cells may be processed as a bad block.

Figure 18:
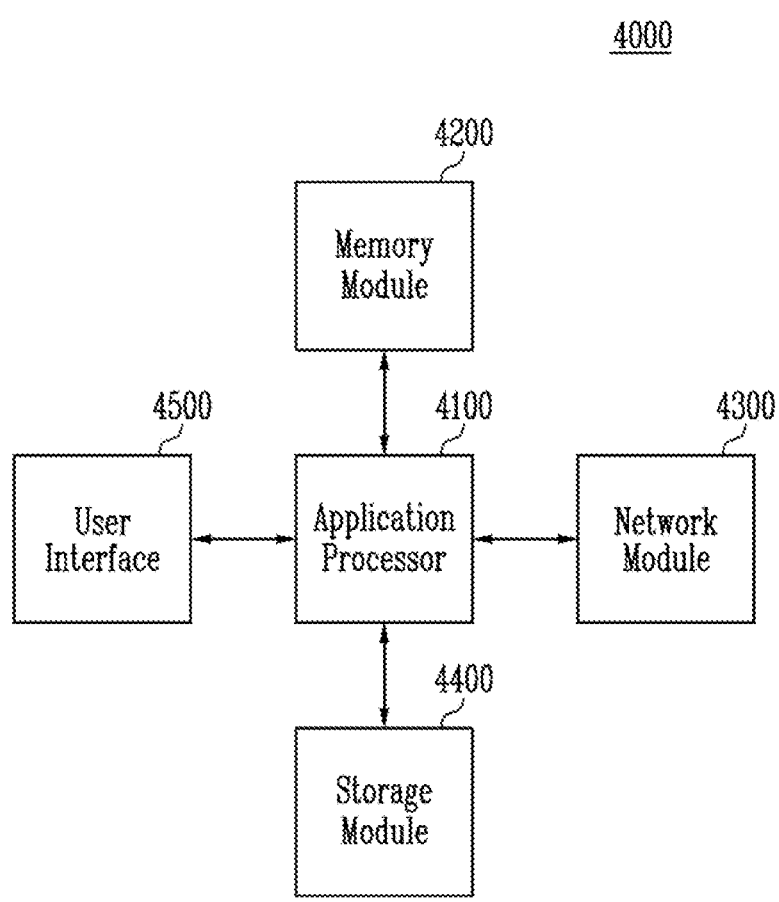
FIG. 18 is a block diagram illustrating a user system to which a storage device according to an embodiment is applied.

FIG. 18 is a block diagram illustrating a user system 4000 to which a storage device according to an embodiment is applied.

Referring to FIG. 18, the user system 4000 may include an application processor 4100, a memory module 4200, a network module 4300, a storage module 4400, and a user interface 4500.

The application processor 4100 may run components included in the user system 4000, an operating system (OS), or a user program. For example, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR3 SDRAM, and LPDDR3 SDRAM or nonvolatile RAMs such as PRAM, ReRAM, MRAM, and FRAM. For example, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. For example, the network module 4300 may be included in the application processor 4100.

The storage module 4400 may store data. For example, the storage module 4400 may store data that is received from the application processor 4100. Alternatively, the storage module 4400 may transmit the data that is stored in the storage module 4400 to the application processor 4100. For example, the storage module 4400 may be embodied as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory with a three-dimensional (3D) structure. For example, the storage module 4400 may be provided as a removable storage medium (i.e., removable drive), such as a memory card or an external drive of the user system 4000.

For example, the storage module 4400 may include a plurality of nonvolatile memory devices, and the plurality of nonvolatile memory devices may be operated in the same manner as the memory device described above with reference to FIGS. 2 and 3. The storage module 4400 may operate in the same manner as the storage device 50 described above with reference to FIG. 1.

The user interface 4500 may include interfaces that input data or instructions to the application processor 4100 or output data to an external device. According to an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

According to an embodiment, the application processor 4100 may determine neighboring strings that are adjacent to a string that comprises a memory cell, among memory cells that are included in the storage module 4400, on which a program operation or a read operation was performed. In addition, the application processor 4100 may select memory cells that are coupled to a predetermined word line, among memory cells of the determined neighboring strings, as monitoring memory cells.

When the monitoring memory cells are selected, the application processor 4100 may control the storage module 4400 to perform a plurality of loops that program the monitoring memory cells into a highest program state. Each of the plurality of loops may include at least one program loop, and the number of program loops included in each loop may vary. In addition, each program loop may include one program operation and one verify operation.

According to an embodiment, when the plurality of loops are performed on the monitoring memory cells, the application processor 4100 may output a suspend command at a predetermined time. The predetermined time may refer to a time at which the number of program loops performed on the storage module 4400 to program the monitoring memory cells is increased.

For example, when one program loop to program the monitoring memory cells is performed, the application processor 4100 may output a suspend command. When the plurality of loops are suspended in response to the suspend command and then resumed, the application processor 4100 may output a suspend command after two program loops are performed. In other words, the suspend command may be output when the number of program loops performed on the storage module 4400 is increased.

According to an embodiment, after the suspend command is output, the application processor 4100 may additionally output a read command. A read operation that corresponds to the read command may be performed by a read voltage for differentiating the highest program state from a program state adjacent to the highest program state so as to check whether the monitoring memory cells are programmed to the highest program state.

In another embodiment, the application processor 4100 may not additionally output the read command after the suspend command is output.

After the suspend command or the read command is output, the application processor 4100 may determine the number of memory cells that are turned off based on verify data that is read during the last verify operation before the suspend command is output, or read data that is read during a read operation that corresponds to the read command.

According to an embodiment, when the last loop, among the plurality of loops, is not performed, the memory controller 4100 may output a program command to resume the suspended loops to the storage module 4400. In other words, suspension and resumption of the plurality of loops may be repeated until the last loop, among the plurality of loops that are performed to program the monitoring memory cells, is performed.

According to an embodiment, after the last loop, among the plurality of loops, is performed, when the suspend command or the read command is output and the number of turned-off memory cells is determined, the application processor 4100 may determine a rate of increase in threshold voltage of a threshold voltage distribution based on turned-off memory cells. The application processor 4100 may determine whether or not to determine a memory block with the monitoring memory cells as a bad block according to the rate of increase in threshold voltage of the threshold voltage distribution.

For example, when the rate of increase in threshold voltage of the threshold voltage distribution of the monitoring memory cells is less than a reference value, the memory block with the monitoring memory cells may not be processed as a bad block. However, when the rate of increase in threshold voltage of the threshold voltage distribution exceeds the reference value, the memory block with the monitoring memory cells may be processed as a bad block.

According to the present disclosure, program loops may be performed on memory cells of a string adjacent to a string that comprises a memory cell on which a program operation or a read operation was performed, and a memory block with memory cells may be processed as a bad block in advance according to a rate of increase in threshold voltage of a threshold voltage distribution of the corresponding memory cells.

What is claimed is:

1. A memory controller controlling a memory device with memory cells that are included in a plurality of strings, respectively, the memory controller comprising:
   a state detector detecting whether the memory device is in an idle state;
   a program controller selecting neighboring strings that are adjacent to a string that comprises a memory cell, among the memory cells, on which a program operation or a read operation was performed, based on detection information that indicates a state of the memory device, selecting monitoring memory cells that are coupled to at least one word line, the monitoring memory cells being a part of the neighboring strings, and controlling the memory device to perform a plurality of loops to program the monitoring memory cells; and
   a bad block selector selecting a memory block with the monitoring memory cells as a bad block based on a rate of increase in threshold voltage of a threshold voltage distribution of the monitoring memory cells.

2. The memory controller of claim 1, wherein the program controller controls the memory device to perform the plurality of loops on the monitoring memory cells when the detection information indicates the idle state.

3. The memory controller of claim 1, wherein the program controller selects memory cells that are coupled to at least one word line, among a word line that is adjacent to a source select line, a word line that is adjacent to a drain select line, and a center word line as the monitoring memory cells,
   wherein the memory cells are a part of the neighboring strings.

4. The memory controller of claim 1, wherein the program controller outputs a program command that provides instructions to program the monitoring memory cells into a highest program state.

5. The memory controller of claim 1, wherein at least one of the plurality of loops includes at least one program loop, and wherein the at least one program loop includes a program operation that applies a program voltage to the at least one word line and a verify operation that applies a verify voltage.

6. The memory controller of claim 5, wherein a program loop that is performed first in each of the plurality of loops is the same.

7. The memory controller of claim 5, wherein the program controller outputs a suspend command that suspends the plurality of loops to the memory device whenever a number of times the at least one program loop that is included in each of the plurality of loops is performed on the memory device is increased.

8. The memory controller of claim 7, wherein the bad block selector determines a number of memory cells that are turned off, among the monitoring memory cells, based on verify data that is read during the verify operation that is performed last before the suspend command is output.

9. The memory controller of claim 8, wherein the bad block selector determines the rate of increase in threshold voltage of the threshold voltage distribution based on the number of memory cells that are turned off.

10. The memory controller of claim 9, wherein the bad block selector selects the memory block with the monitoring memory cells as the bad block when the rate of increase in threshold voltage of the threshold voltage distribution is greater than a reference value.

11. The memory controller of claim 7, wherein the program controller outputs a read command for reading the monitoring memory cells after outputting the suspend command.

12. The memory controller of claim 11, wherein the bad block selector determines a number of memory cells that are turned off, among the monitoring memory cells, based on data that is read during a read operation that corresponds to the read command.

13. The memory controller of claim 12, wherein the bad block selector determines the rate of increase in threshold voltage of the threshold voltage distribution based on the number of memory cells that are turned off.

14. The memory controller of claim 13, wherein the bad block selector selects the memory block with the monitoring memory cells as the bad block when the rate of increase in threshold voltage of the threshold voltage distribution is greater than a reference value.

15. A method of operating a memory controller controlling a memory device with memory cells that are included in a plurality of strings, respectively, the method comprising:
   detecting a state of the memory device;
   selecting neighboring strings that are adjacent to a string that comprises a memory cell, among the memory cells, on which a program operation or a read operation was performed, based on an idle state of the memory device;
   selecting memory cells that are included in at least one word line as monitoring memory cells, wherein the memory cells are a part of the neighboring strings;
   outputting a program command to perform a plurality of loops to program the monitoring memory cells; and
   selecting a memory block with the monitoring memory cells as a bad block based on a rate of increase in threshold voltage of a threshold voltage distribution of the monitoring memory cells.

16. The method of claim 15, wherein each of the plurality of loops includes at least one program loop, and wherein the at least one program loop includes a program operation that applies a program voltage to the at least one word line and a verify operation that applies a verify voltage.

17. The method of claim 16, further comprising outputting a suspend command that suspends the plurality of loops to the memory device whenever a number of times the at least one program loop that is included in each of the plurality of loops is performed on the memory device is increased after outputting the program command.

18. The method of claim 17, wherein the selecting as the bad block comprises:
determining a number of memory cells that are turned off, among the monitoring memory cells, based on verify data that is read during the verify operation that is performed last before outputting the suspend command;
determining a rate of increase in threshold voltage of the threshold voltage distribution based on the number of memory cells that are turned off; and
selecting the memory block with the monitoring memory cells as the bad block when the rate of increase in threshold voltage of the threshold voltage distribution is greater than a reference value.

19. A storage device, comprising:
a memory device including memory cells that are included in each of a plurality of strings; and
a memory controller detecting whether the memory device is in an idle state or not, selecting memory cells that are adjacent to a memory cell on which a program operation or a read operation was performed, among the memory cells, as monitoring memory cells, controlling the memory device to perform a plurality of loops that program the monitoring memory cells, and selecting a memory block with the monitoring memory cells as a bad block based on a rate of increase in threshold voltage of a threshold voltage distribution of the monitoring memory cells.

20. The storage device of claim 19, wherein the memory controller determines a number of memory cells that are turned off, among the monitoring memory cells, based on verify data that is read during a last verify operation in each of the plurality of loops, and
wherein the memory controller selects the memory block with the monitoring memory cells as the bad block based on the rate of increase in threshold voltage of the threshold voltage distribution determined based on the number of memory cells that are turned off.

* * * * *